United States Patent (12)
Miyoshi et al.

(10) Patent No.: US 10,178,775 B2
(45) Date of Patent: Jan. 8, 2019

(54) COPPER FOIL PROVIDED WITH CARRIER, LAMINATE, PRINTED WIRING BOARD, AND METHOD FOR FABRICATING PRINTED WIRING BOARD

(71) Applicant: JX NIPPON MINING & METALS CORPORATION, Tokyo (JP)

(72) Inventors: Yoshiyuki Miyoshi, Ibaraki (JP); Michiya Kohiki, Ibaraki (JP); Masafumi Ishii, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 83 days.

(21) Appl. No.: 15/002,060

(22) Filed: Jan. 20, 2016

(65) Prior Publication Data
US 2016/0212857 A1   Jul. 21, 2016

(30) Foreign Application Priority Data
Jan. 21, 2015 (JP) ................................. 2015-009884

(51) Int. Cl.
  *H05K 3/02* (2006.01)
  *H05K 1/09* (2006.01)
  (Continued)

(52) U.S. Cl.
  CPC .............. *H05K 3/025* (2013.01); *C25D 5/10* (2013.01); *C25D 7/0614* (2013.01); *C25D 1/04* (2013.01); *C25D 3/38* (2013.01); *C25D 5/022* (2013.01); *H05K 3/205* (2013.01); *H05K 3/4007* (2013.01); *H05K 3/421* (2013.01); *H05K 2203/0152* (2013.01); *H05K 2203/0156* (2013.01); *H05K 2203/0307* (2013.01); *H05K 2203/0723* (2013.01); *H05K 2203/0726* (2013.01)

(58) Field of Classification Search
CPC ...................................................... H05K 3/025
See application file for complete search history.

(56) References Cited

U.S. PATENT DOCUMENTS

| | | | | |
|---|---|---|---|---|
| 5,114,543 | A * | 5/1992 | Kajiwara | ............... H05K 3/025 |
| | | | | 205/152 |
| 7,026,059 | B2 | 4/2006 | Suzuki et al. | |
| 2003/0012975 | A1* | 1/2003 | Gales | ....................... C25D 1/04 |
| | | | | 428/607 |

FOREIGN PATENT DOCUMENTS

| | | |
|---|---|---|
| EP | 2615196 A1 | 7/2013 |
| JP | 2003524078 A | 8/2003 |

(Continued)

OTHER PUBLICATIONS

European Search Report in EP Application No. 16152156.2 dated Mar. 9, 2017.

*Primary Examiner* — Timothy J Thompson
*Assistant Examiner* — Amol H Patel
(74) *Attorney, Agent, or Firm* — Drinker Biddle & Reath LLP

(57) ABSTRACT

Provided is a copper foil provided with a carrier which enables, in a laminate produced by laminating a copper foil provided with a carrier on a resin substrate, to peel the ultrathin copper layer from the carrier well. A copper foil provided with a carrier having, in order, a carrier, an intermediate layer, and an ultrathin copper layer, wherein, when the surface of the carrier opposite to the ultrathin copper layer is measured using a laser microscope based on JIS B0601-1994, the ten point average roughness Rz of the surface is 6.0 μm or less.

21 Claims, 5 Drawing Sheets

(51) Int. Cl.
*C25D 5/10* (2006.01)
*C25D 7/06* (2006.01)
H05K 3/20 (2006.01)
H05K 3/40 (2006.01)
H05K 3/42 (2006.01)
C25D 1/04 (2006.01)
C25D 3/38 (2006.01)
C25D 5/02 (2006.01)

(56) References Cited

FOREIGN PATENT DOCUMENTS

| | | |
|---|---|---|
| JP | 2006022406 A | 1/2006 |
| JP | 2008140902 A | 6/2008 |
| JP | 2009004423 A | 1/2009 |
| JP | 2012099857 A | 5/2012 |
| JP | 2013030603 A | 2/2013 |
| JP | 2014141061 A | 8/2014 |
| JP | 2015010275 A | 1/2015 |
| WO | 01/63016 A1 | 8/2001 |
| WO | 2013047272 A1 | 4/2013 |
| WO | 2014136785 A1 | 9/2014 |
| WO | 2014157728 A1 | 10/2014 |
| WO | 2014192895 A1 | 12/2014 |

\* cited by examiner

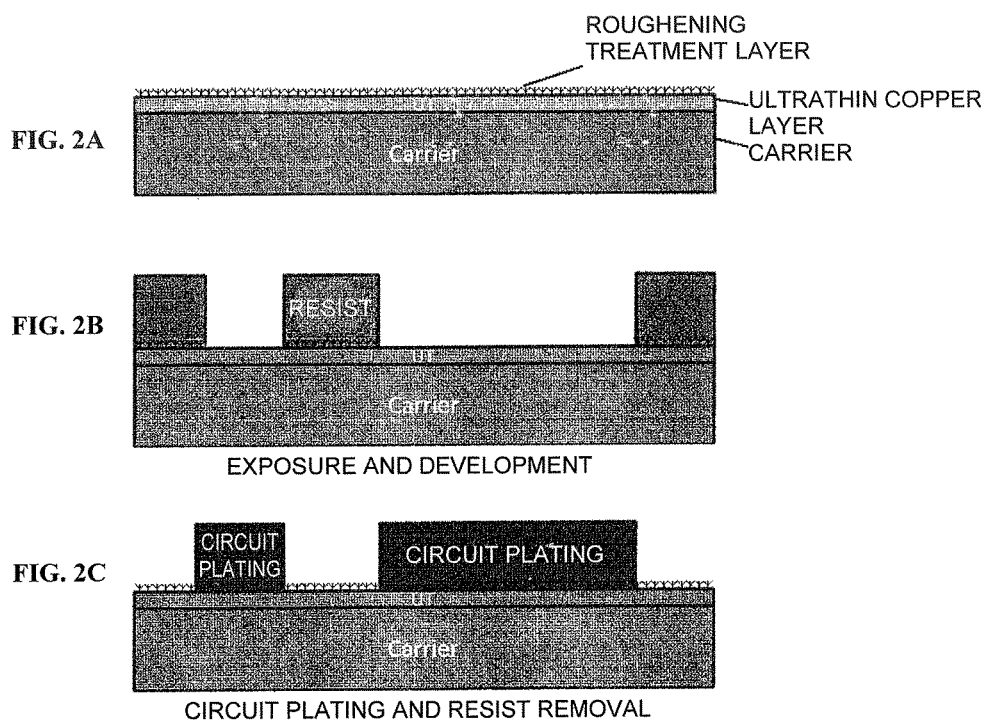

RESIN AND COPPER FOIL PROVIDED WITH A
CARRIER LAMINATION

RELEASE OF SECOND LAYER OF CARRIER FOIL

LASER HOLE OPENING

VIA FILL

SECOND LAYER CIRCUIT PLATING

RELEASE OF FIRST LAYER CARRIER FOIL

FLASH ETCHING

BUMP AND COPPER PILLAR FORMATION

12
COPPER FOIL PROVIDED WITH CARRIER, LAMINATE, PRINTED WIRING BOARD, AND METHOD FOR FABRICATING PRINTED WIRING BOARD

TECHNICAL FIELD

The present invention relates to a copper foil provided with a carrier, a laminate, a printed wiring board, and a method for fabricating a printed wiring board.

BACKGROUND ART

A printed wiring board has made a great progress in the last half century and today has been used for almost all electronic devices. High-density implementation of mounted components and handling of signals at higher frequencies have been progressed along with the increase of the recent needs for smaller electronic devices with a higher performance, and printed wiring boards are needed to have a fine conductive pattern (fine pitch) and to deal with high frequencies, for example. Particularly in the case that an IC chip is mounted on a printed wiring board, a fine pitch with L (line)/S (space)=20 μm/20 μm or less is required.

A printed wiring board is first fabricated as a copper-clad laminate in which a copper foil is pasted on an insulating substrate primarily containing a glass epoxy substrate, a BT resin, a polyimide film, or the like. For pasting is employed a method (laminating method) in which an insulating substrate and a copper foil are stacked together followed by heating and pressing for formation, or a method (casting method) in which the face having a coating layer of a copper foil is coated with a varnish as a precursor for an insulating substrate material followed by heating/curing.

The foil thickness is getting smaller in association with the popularization of a fine pitch; for example, the thickness of a copper foil used for a copper-clad laminate is now 9 μm or less, or even 5 μm or less. However, the foil thickness of 9 μm or less extremely deteriorates the handleability in forming a copper-clad laminate using the above-described laminating method or casting method. Accordingly, a copper foil provided with a carrier has been developed in which an ultrathin copper layer is formed above a thick metal foil, which is utilized for a carrier, with a peel layer sandwiched therebetween. In a common method for using a copper foil provided with a carrier, the surface of the ultrathin copper layer is pasted on a resin substrate to heat and pressure-bond and thereafter the carrier is peeled off via the peel layer, as disclosed in Patent Literature 1 or the like.

In a typical method for using a copper foil provided with a carrier in producing a printed wiring board using a copper foil provided with a carrier, a copper foil provided with a carrier is first laminated on a resin substrate from the ultrathin copper layer side and then the carrier is peeled from the ultrathin copper layer. Next, a plating resist formed from a photocurable resin is provided on the exposed ultrathin copper layer from which the carrier has been peeled. And then, a predetermined region of the plating resist is exposed to a light to cure the region. Subsequently, the uncured plating resist in the non-exposed region is removed and thereafter an electrolytic plating layer is provided in the resist-removed region. The cured plating resist is then removed to obtain a resin substrate on which a circuit is formed, which is used to produce a printed wiring board.

CITATION LIST

Patent Literature

Patent Literature 1 Japanese Patent Laid-Open No. 2006-022406

SUMMARY OF INVENTION

Technical Problem

Although the above-described method in which a copper foil provided with a carrier is laminated on a resin substrate from the ultrathin copper layer side and thereafter the carrier is peeled from the ultrathin copper layer is common as a method for fabricating a printed wiring board using a copper foil provided with a carrier, there exists a method for producing a laminate (burying/build-up method) in which, after a resin substrate is provided in advance not on the ultrathin copper layer side surface but on the carrier side surface of a copper foil provided with a carrier, a circuit plating is formed on the ultrathin copper layer side surface of the copper foil provided with a carrier, and a resin layer is laminated by providing a buried resin above the ultrathin copper layer so as to cover the circuit plating formed (so that the circuit plating is buried) followed by further providing a copper layer above the resin layer (FIG. 1). Further, there exists a method for producing a laminate (build-up method) in which, after a resin substrate is provided in advance not on the ultrathin copper layer side surface but on the carrier side surface of a copper foil provided with a carrier, a resin layer and a circuit are formed at least one or more times on the ultrathin copper layer side surface of the copper foil provided with a carrier.

The ultrathin copper layer in a laminate needs to be peeled from the carrier well, but the peel strength between the ultrathin copper layer and the carrier is significantly increased in a laminate formed using such a method, which causes a problem of difficulty in peeling the ultrathin copper layer from the carrier well.

Accordingly, it is the object of the present invention to provide a copper foil provided with a carrier which enables, in a laminate produced by laminating a copper foil provided with a carrier on a resin substrate, to peel the ultrathin copper layer from the carrier well.

Solution to Problem

In diligent research to achieve the above object, the present inventors focused on the fact that a roughening treatment is performed for the carrier surface of a laminate having a configuration in which a resin substrate is provided on the carrier side in order to paste on the resin substrate well, and as a result discovered that the roughness of the surface of the carrier on the side pasted on the resin substrate is increased depending on the degree of a roughening treatment thereof, which significantly increases the peel strength of the ultrathin copper layer from the carrier in the laminate. In addition, the present inventors discovered that controlling the surface roughness of the surface of the carrier on the side on which the resin substrate is pasted, i.e., the surface of the carrier opposite to the surface on which the ultrathin copper layer is formed enables to peel the ultrathin copper layer from the carrier well.

The present invention, which was completed based on the above knowledge, is, in one aspect, a copper foil provided with a carrier having, in order, a carrier, an intermediate layer, and an ultrathin copper layer, wherein, when the surface of the carrier opposite to the ultrathin copper layer is measured using a laser microscope based on JIS B0601-1994, the ten point average roughness Rz of the surface is 6.0 μm or less.

The present invention is, in another aspect, a copper foil provided with a carrier having, in order, a carrier, an intermediate layer, and an ultrathin copper layer, wherein, when the surface of the carrier opposite to the ultrathin copper layer is measured using a laser microscope based on JIS B0601-1994, the arithmetic average roughness Ra of the surface is 1.0 μm or less.

The present invention is, in yet another aspect, a copper foil provided with a carrier having, in order, a carrier, an intermediate layer, and an ultrathin copper layer, wherein, when the surface of the carrier opposite to the ultrathin copper layer is measured using a laser microscope based on JIS B0601-2001, the maximum cross-sectional height Rt in the roughness curve of the surface is 7.0 μm or less.

In yet another embodiment of the copper foil provided with a carrier according to the present invention, when the surface of the carrier opposite to the ultrathin copper layer is measured using a laser microscope based on JIS B0601-1994, the ten point average roughness Rz of the surface is 0.9 μm or more.

In yet another embodiment of the copper foil provided with a carrier according to the present invention, when the surface of the carrier opposite to the ultrathin copper layer is measured using a laser microscope based on JIS B0601-1994, the arithmetic average roughness Ra of the surface is 0.12 μm or more.

In yet another embodiment of the copper foil provided with a carrier according to the present invention, when the surface of the carrier opposite to the ultrathin copper layer is measured using a laser microscope based on JIS B0601-2001, the maximum cross-sectional height Rt in the roughness curve of the surface is 1.1 μm or more.

In yet another embodiment of the copper foil provided with a carrier according to the present invention, a roughened layer is formed on the surface of the carrier opposite to the ultrathin copper layer.

In yet another embodiment of the copper foil provided with a carrier according to the present invention, the copper foil provided with a carrier has one or more layers selected from the group consisting of a heat resistant layer, an anti-corrosion layer, a chromate-treated layer, and a silane coupling-treated layer above the roughened layer formed on the surface of the carrier opposite to the ultrathin copper layer.

In yet another embodiment of the copper foil provided with a carrier according to the present invention, the roughened layer formed on the surface of the carrier opposite to the ultrathin copper layer is a layer consisting of a simple substance selected from the group consisting of copper, nickel, cobalt, phosphorus, tungsten, arsenic, molybdenum, chromium, and zinc, or an alloy containing one or more thereof.

In yet another embodiment of the copper foil provided with a carrier according to the present invention, the roughened layer formed on the surface of the carrier opposite to the ultrathin copper layer is formed using a sulfuric acid-copper sulfate electrolytic bath containing one or more selected from the group consisting of a sulfuric acid alkyl ester salt, tungsten, and arsenic.

In yet another embodiment of the copper foil provided with a carrier according to the present invention, no roughened layer is formed on the surface of the carrier opposite to the ultrathin copper layer.

In yet another embodiment of the copper foil provided with a carrier according to the present invention, the copper foil provided with a carrier has one or more layers selected from the group consisting of a heat resistant layer, an anti-corrosion layer, a chromate-treated layer, and a silane coupling-treated layer on the surface of the carrier opposite to the ultrathin copper layer.

In yet another embodiment of the copper foil provided with a carrier according to the present invention, a roughened layer is formed on the ultrathin copper layer surface.

In yet another embodiment of the copper foil provided with a carrier according to the present invention, the roughened layer formed on the ultrathin copper layer surface is a layer consisting of a simple substance selected from the group consisting of copper, nickel, cobalt, phosphorus, tungsten, arsenic, molybdenum, chromium, and zinc, or an alloy containing one or more thereof.

In yet another embodiment of the copper foil provided with a carrier according to the present invention, the copper foil provided with a carrier includes a resin layer on the surface of the roughened layer formed on the ultrathin copper layer surface.

In yet another embodiment of the copper foil provided with a carrier according to the present invention, the copper foil provided with a carrier has one or more layers selected from the group consisting of a heat resistant layer, an anti-corrosion layer, a chromate-treated layer, and a silane coupling-treated layer on the surface of the roughened layer formed on the ultrathin copper layer surface.

In yet another embodiment of the copper foil provided with a carrier according to the present invention, the copper foil provided with a carrier includes a resin layer above one or more layers selected from the group consisting of the heat resistant layer, an anti-corrosion layer, a chromate-treated layer, and a silane coupling-treated layer provided on the surface of the roughened layer formed on the ultrathin copper layer surface.

In yet another embodiment of the copper foil provided with a carrier according to the present invention, the copper foil provided with a carrier includes a resin layer on the ultrathin copper layer surface.

In yet another embodiment of the copper foil provided with a carrier according to the present invention, the resin layer is a resin for adhesion.

In yet another embodiment of the copper foil provided with a carrier according to the present invention, the resin layer is a resin in a semi-cured state.

The present invention is, in yet another aspect, a laminate fabricated using the copper foil provided with a carrier according to the present invention.

The present invention is, in yet another aspect, is a laminate including the copper foil provided with a carrier according to the present invention and a resin, wherein a part or all of an edge face of the copper foil provided with a carrier is covered with the resin.

The present invention is, in yet another aspect, a printed wiring board fabricated using the copper foil provided with a carrier according to the present invention.

In yet another aspect, the present invention is a method for fabricating a printed wiring board including:
forming a copper-clad laminate by carrying out a step of preparing the copper foil provided with a carrier according to the present invention and an insulating substrate, a step of laminating the copper foil provided with a carrier and the insulating substrate, and a step of, after the copper foil provided with a carrier and the insulating substrate have been laminated, peeling the carrier of the copper foil provided with a carrier; and then forming a circuit by any of a semi-additive method, a subtractive method, a partly additive method, and a modified semi-additive method.

The present invention is, in yet another aspect, a method for fabricating a printed wiring board including:

a step of forming a circuit on the ultrathin copper layer side surface of the copper foil provided with a carrier according to the present invention;

a step of forming a resin layer on the ultrathin copper layer side surface of the copper foil provided with a carrier so that the circuit is buried;

a step of forming a circuit on the resin layer;

a step of peeling the carrier after forming the circuit on the resin layer; and a step of exposing the circuit buried in the resin layer that is formed on the ultrathin copper layer side surface by, after the carrier has been peeled off, removing the ultrathin copper layer.

The present invention is, in yet another aspect, a method for fabricating a printed wiring board including:

a step of laminating the copper foil provided with a carrier according to the present invention on a resin substrate from the carrier side;

a step of forming a circuit on the ultrathin copper layer side surface of the copper foil provided with a carrier;

a step of forming a resin layer on the ultrathin copper layer side surface of the copper foil provided with a carrier so that the circuit is buried;

a step of forming a circuit on the resin layer;

a step of peeling the carrier after forming the circuit on the resin layer; and a step of exposing the circuit buried in the resin layer that is formed on the ultrathin copper layer side surface by, after the carrier has been peeled off, removing the ultrathin copper layer.

The present invention is, in yet another aspect, is a method for fabricating a printed wiring board including:

a step of laminating the ultrathin copper layer side surface or the carrier side surface of the copper foil provided with a carrier according to the present invention and a resin substrate;

a step of providing two layers of a resin layer and a circuit at least one time on the ultrathin copper layer side surface or the carrier side surface of the copper foil provided with a carrier opposite to a side with the resin substrate laminated thereon; and a step of, after the two layers of the resin layer and the circuit have been formed, peeling the carrier or the ultrathin copper layer from the copper foil provided with a carrier.

The present invention is, in yet another aspect, is a method for fabricating a printed wiring board including:

a step of laminating the carrier side surface of the copper foil provided with a carrier according to the present invention and a resin substrate;

a step of providing two layers of a resin layer and a circuit at least one time on the ultrathin copper layer side surface of the copper foil provided with a carrier opposite to a side with the resin substrate laminated thereon; and a step of, after the two layers of the resin layer and the circuit have been formed, peeling the carrier from the copper foil provided with a carrier.

The present invention is, in yet another aspect, a method for fabricating a printed wiring board including:

a step of providing two layers of a resin layer and a circuit at least one time on one side or both sides of the laminate according to the present invention; and a step of, after the two layers of the resin layer and the circuit have been formed, peeling the carrier or the ultrathin copper layer from the copper foil provided with a carrier constituting the laminate.

Advantageous Effects of Invention

According to the present invention, a copper foil provided with a carrier can be provided which enables, in a laminate produced by laminating a copper foil provided with a carrier on a resin substrate, to peel the ultrathin copper layer from the carrier well.

BRIEF DESCRIPTION OF DRAWINGS

FIGS. 2A to 2C are schematic views of a circuit board cross-section during steps until circuit plating and resist removal according to a specific example of the method for fabricating a printed wiring board using the copper foil provided with a carrier according to the present invention.

DESCRIPTION OF EMBODIMENTS

Copper Foil Provided with Carrier

Figure 1:
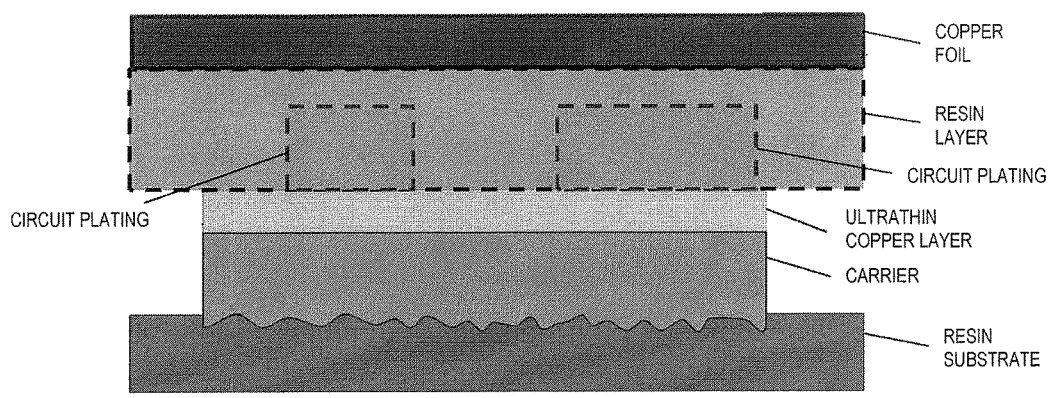
FIG. 1 is a cross-sectional schematic view of a laminate formed using a burying/build-up method.

The copper foil provided with a carrier of the present invention, has, in order, a carrier, an intermediate layer, and an ultrathin copper layer. Methods for using a copper foil provided with a carrier itself are well known to those skilled in the art. For example, the surface of the ultrathin copper layer is pasted on an insulating substrate such as a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, a polyester film and a polyimide film followed by heating and pressure-bonding; the carrier is then peeled off; the ultrathin copper layer adhered to the insulating substrate is etched in an intended conductive pattern; and eventually a laminate (a copper-clad laminate or the like), a printed wiring board, or the like can be fabricated.

Carrier

The carrier that can be used in the present invention is typically a metal foil or a resin film, and provided in the form of, for example, a copper foil, a copper alloy foil, a nickel foil, a nickel alloy foil, an iron foil, an iron alloy foil, a stainless steel foil, an aluminum foil, an aluminum alloy foil, an insulating resin film, a polyimide film, and an LCD film.

The carrier that can be used in the present invention is typically provided in the form of a rolled copper foil or an electrolytic copper foil. Commonly, an electrolytic copper foil is fabricated by electrolytic deposition of copper on a titanium or stainless steel drum from a copper sulfate bath, and a rolled copper foil is fabricated by repeating plastic working and heat treatment with a mill roll. As the material for the copper foil, in addition to high-purity copper, such as tough pitch copper (JIS H3100 alloy number C1100) and oxygen-free copper (JIS H3100 alloy number C1020 or JIS H3510 alloy number C1011), for example, copper alloys can also be used, such as Sn-containing copper, Ag-containing copper, a copper alloy to which Cr, Zr, Mg, or the like has been added, or a Colson copper alloy to which Ni, Si, and the like has been added. The carrier is preferably an electrolytic copper foil or a rolled copper foil because of a high conductivity, and further the carrier is more preferably an electrolytic copper foil because fabricating cost is low and it is easier to control the roughness of the carrier side surface. Note that, when the term "copper foil" is used singly herein, a copper alloy foil is also included therein.

Although the thickness of the carrier that can be used in the present invention is not especially limited, the carrier may be appropriately adjusted to a suitable thickness in view its role as a carrier, such as, for example, 12 μm or more. However, since production costs increase if the carrier is too thick, generally it is preferred that the thickness is 35 μm or less. Therefore, the thickness of the carrier is typically 12 to 300 μm, more typically 12 to 150 μm, more typically 12 to 70 μm, and more typically 18 to 35 μm.

Roughness of Carrier Surface

In a build-up method or the like, in which a resin substrate is provided on the carrier side surface of a copper foil provided with a carrier and then, while supporting it, a circuit and a resin layer for burying a circuit or the like are provided one or more times on the ultrathin copper layer side to form a laminate, the roughness of the surface of the carrier opposite to the ultrathin copper layer influences the peel strength between the ultrathin copper layer and the carrier in the laminate. It is believed that this is because, in forming an ultrathin copper layer above a carrier with an intermediate layer sandwiched therebetween, the roughness of the surface of the carrier opposite to the ultrathin copper layer larger than a predetermined value has some impact on the intermediate layer to increase the peel strength, for example. Although this reason is not clear, the roughness of the surface of the carrier opposite to the ultrathin copper layer larger than a predetermined value makes the current pathway on the surface of the carrier opposite to the ultrathin copper layer longer to make the surface less conductive, and as a result much current flows through the ultrathin copper layer side surface of the carrier, i.e., the intermediate layer and the ultrathin copper layer more easily than in conventional cases, which may be the cause of the influence. Further, even in the case that the roughness of the surface of the carrier opposite to the ultrathin copper layer is small in producing a copper foil provided with a carrier, when the surface of the carrier opposite to the ultrathin copper layer is subjected to a roughening treatment after formation of the copper foil provided with a carrier until the roughness exceeds a predetermined value, for example, in order to adhere to a resin substrate well, the peel strength is increased similarly. It is believed that this is because a current flowing in the direction opposite to that of a current in forming the ultrathin copper layer (reverse current) is generated in the intermediate layer in the step of roughening.

From this perspective, in the copper foil provided with a carrier according to the present invention, when the surface of the carrier opposite to the ultrathin copper layer is measured using a laser microscope based on JIS B0601-1994, the ten point average roughness Rz of the surface is controlled to be 6.0 μm or less. If the ten point average roughness Rz of the surface of the carrier opposite to the ultrathin copper layer is 6.0 μm or less, the peel strength of the ultrathin copper layer from the carrier is suppressed, which enables to peel the ultrathin copper layer form the carrier well. Rz is preferably 5.0 μm or less, more preferably 4.0 μm or less, and more preferably 3.5 μm or less. However, since too small Rz lowers the adhesion force to a resin substrate, Rz is preferably 0.9 μm or more, preferably 1.0 μm or more, preferably 1.1 μm or more, more preferably 1.5 μm or more, and even more preferably 2.0 μm or more.

Further, in another aspect of the copper foil provided with a carrier according to the present invention, when the surface of the carrier opposite to the ultrathin copper layer is measured using a laser microscope based on JIS B0601-1994, the arithmetic average roughness Ra of the surface is controlled to be 1.0 μm or less. If the arithmetic average roughness Ra of the surface of the carrier opposite to the ultrathin copper layer is 1.0 μm or less, the peel strength of the ultrathin copper layer from the carrier is suppressed, which enables to peel the ultrathin copper layer form the carrier well. Ra is preferably 0.8 μm or less, more preferably 0.7 μm or less, and more preferably 0.6 μm or less. However, since too small Ra lowers the adhesion force to a resin substrate, Ra is preferably 0.12 μm or more, preferably 0.15 μm or more, preferably 0.2 μm or more, more preferably 0.22 μm or more, and even more preferably 0.3 μm or more.

Furthermore, in yet another aspect of the copper foil provided with a carrier according to the present invention, when the surface of the carrier opposite to the ultrathin copper layer is measured using a laser microscope based on JIS B0601-2001, the maximum cross-sectional height Rt in the roughness curve of the surface is controlled to be 7.0 μm or less. If the maximum cross-sectional height Rt of the surface of the carrier opposite to the ultrathin copper layer is 7.0 μm or less, the peel strength of the ultrathin copper layer from the carrier is suppressed, which enables to peel the ultrathin copper layer form the carrier well. Rt is preferably 6.0 μm or less, more preferably 5.0 μm or less, and more preferably 4.0 μm or less. However, since too small Rt lowers the adhesion force to a resin substrate, Rt is preferably 1.1 μm or more, preferably 1.2 μm or more, preferably 1.3 μm or more, more preferably 1.5 μm or more, and even more preferably 2.0 μm or more.

In the present invention, in the case that a roughened layer described below is formed, each of the above roughnesses of the surface of the carrier opposite to the ultrathin copper layer (Rz, Ra, Rt) represents the roughness of the roughened layer surface, and in the case that a heat resistant layer, an anti-corrosion layer, a chromate-treated layer, and/or a silane coupling-treated layer described below are/is further formed on the roughened layer surface, the roughness of the surface of the outermost layer among them. Also in the case that a roughened layer is not formed on the carrier and a heat resistant layer, an anti-corrosion layer, a chromate-treated layer, and/or a silane coupling-treated layer are/is formed directly on the carrier, each of the above roughnesses of the surface of the carrier opposite to the ultrathin copper layer (Rz, Ra, Rt) represents the roughness of the surface of the outermost layer among them.

Intermediate Layer

The intermediate layer is provided above the carrier. Another layer may also be provided between the carrier and the intermediate layer. The intermediate layer used in the present invention is not especially limited, as long as the configuration of the copper foil provided with a carrier is such that the ultrathin copper layer does not easily peel from the carrier before the lamination step onto an insulating substrate, and such that the ultrathin copper layer can peel from the carrier after the lamination step onto the insulating substrate. For example, the intermediate layer of the copper foil provided with a carrier according to the present invention may include one or two or more selected from the group consisting of Cr, Ni, Co, Fe, Mo, Ti, W, P, Cu, Al, and Zn, alloys thereof, hydrates thereof, oxides thereof, and organic substances. Further, a plurality of intermediate layers may be provided.

In addition, for example, the intermediate layer can be configured from the carrier side from a single metal layer formed from one element selected from the group of elements consisting of Cr, Ni, Co, Fe, Mo, Ti, W, P, Cu, Al, and Zn, or, configured by forming an alloy layer formed from one or two or more elements selected from the group of elements consisting of Cr, Ni, Co, Fe, Mo, Ti, W, P, Cu, Al, and Zn, and forming above that layer a layer formed from a hydrate or an oxide or an organic substance of one or two or more elements selected from the group of elements consisting of Cr, Ni, Co, Fe, Mo, Ti, W, P, Cu, Al, and Zn.

In addition, for example, the intermediate layer can be configured from the carrier side from a single metal layer formed from any one element of the group of elements of Cr, Ni, Co, Fe, Mo, Ti, W, P, Cu, Al, and Zn, or, configured by forming an alloy layer formed from one or more elements selected from the group of elements of Cr, Ni, Co, Fe, Mo, Ti, W, P, Cu, Al, and Zn, or an organic substance layer and subsequently forming a single metal layer formed from any one element of the group of elements of Cr, Ni, Co, Fe, Mo, Ti, W, P, Cu, Al, and Zn or an alloy layer formed from one or more elements selected from the group of elements of Cr, Ni, Co, Fe, Mo, Ti, W, P, Cu, Al, and Zn. Further, a layer configuration which can be used as the intermediate layer may be used for the other layer.

Further, for example, the intermediate layer can be configured by laminating a nickel layer, a nickel-phosphorus alloy layer, or a nickel-cobalt alloy layer, and a chromium-containing layer, in that order, on the carrier. Since the adhesive strength between nickel and copper is higher than the adhesive strength between chromium and copper, when the ultrathin copper layer is peeled, the peeling occurs at the interface between the ultrathin copper layer and the chromium. Further, the nickel in the intermediate layer can be expected to provide a barrier effect that prevents the diffusion of the copper component from the carrier into the ultrathin copper layer. The amount of nickel deposited in the intermediate layer is preferably 100 μg/dm² or more and 40,000 μg/dm² or less, more preferably 100 μg/dm² or more and 4,000 μg/dm² or less, more preferably 100 μg/dm² or more and 2,500 μg/dm² or less, and more preferably 100 μg/dm² or more and less than 1,000 μg/dm². The amount of chromium deposited in the intermediate layer is preferably 5 μg/dm² or more and 500 μg/dm² or less, and more preferably 5 μg/dm² or more and 100 μg/dm² or less.

The chromium-containing layer may be a chromium plating layer, a chromium alloy plating layer, or a chromate-treated layer. Here, a chromate-treated layer refers to a layer treated with a solution containing chromic anhydride, chromic acid, dichromic acid, a chromate or a dichromate. The chromate-treated layer may contain an element such as cobalt, iron, nickel, molybdenum, zinc, tantalum, copper, aluminum, phosphorus, tungsten, tin, arsenic, and titanium (any form is available such as a metal, an alloy, an oxide, a nitride, and a sulfide). Specific examples of the chromate-treated layer include a chromate-treated layer which has been treated with chromic anhydride or an aqueous solution of potassium dichromate and a chromate-treated layer which has been treated with a treatment solution containing chromic anhydride or potassium dichromate and zinc.

The intermediate layer of the copper foil provided with a carrier according to the present invention has a configuration in which a nickel layer or an alloy layer containing nickel, and an organic substance layer containing any of a nitrogen-containing organic compound, a sulfur-containing organic compound, and a carboxylic acid are laminated in order on the carrier, and the amount of nickel deposited in the intermediate layer may be 100 to 40,000 μm/dm².

Further, it is preferred to use an organic substance consisting of one or two or more selected from a nitrogen-containing organic compound, a sulfur-containing organic compound, and a carboxylic acid as the organic substance contained in the intermediate layer, for example. Among a nitrogen-containing organic compound, a sulfur-containing organic compound, and a carboxylic acid, a nitrogen-containing organic compound includes a nitrogen-containing organic compound having a substituent. Specifically, it is preferred to use 1,2,3-benzotriazole, carboxybenzotriazole, N',N'-bis(benzotriazolylmethyl)urea, 1H-1,2,4-triazole, 3-amino-1H-1,2,4-triazole, and the like, which are triazole compounds that have a substituent, as the nitrogen-containing organic compound.

For the sulfur-containing organic compound, it is preferred to use mercaptobenzothiazole, thiocyanuric acid, 2-benzimidazolethiol, and the like.

For the carboxylic acid, it is especially preferred to use a monocarboxylic acid, and among these, oleic acid, linoleic acid, linolenic acid, and the like.

The above-described organic substance is preferably contained at a thickness of 8 nm or more and 80 nm or less, and more preferably 30 nm or more and 70 nm or less. The intermediate layer may contain multiple kinds of (one or more) the above-described organic substance.

Here, the thickness of the organic substance can be measured as follows.

Thickness of Organic Substance in Intermediate Layer

After the ultrathin copper layer of a copper foil provided with a carrier is peeled from the carrier, the exposed surface on the intermediate layer side of the ultrathin copper layer and the exposed surface on the intermediate layer side of the carrier are subjected to XPS measurement to make depth profiles. And then, when the depth at which the carbon concentration reaches 3 at % or less for the first time from the surface on the intermediate layer side of the ultrathin copper layer is defined as A (nm), and the depth at which the carbon concentration reaches 3 at % or less for the first time from the surface on the intermediate layer side of the carrier is defined as B (nm), the sum of A and B can be regarded as the thickness (nm) of the organic substance in the intermediate layer.

The operating conditions for XPS are shown below.
Apparatus: XPS measuring apparatus (ULVAC-PHI, INCORPORATED, model 5600MC)
Ultimate degree of vacuum: $3.8 \times 10^{-7}$ Pa
X ray: monochromatic Al Kα or non-monochromatic Mg Kα, X-ray output: 300 W, detection area: 800 μmφ, angle between sample and detector: 45°
Ion beam: ion species: $Ar^+$, accelerating voltage: 3 kV, scanning area: 3 mm×3 mm, sputtering rate: 2.8 nm/min (in terms of $SiO_2$)

A method for using the organic substance contained in an intermediate layer will be described in the following with reference also to a method for forming an intermediate layer on a carrier foil. Formation of an intermediate layer on a carrier can be carried out by dissolving the above-described organic substance in a solvent and soaking a carrier in the solvent, or by using showering, a spraying method, a dropping method, an electrodeposition method, or the like for the surface on which an intermediate layer is to be formed, and it is unnecessary to employ a particularly limited method. In this case, the concentration of an organic agent in the solvent is preferably 0.01 g/L to 30 g/L, and the solution temperature is preferably in the range of 20 to 60° C. for all of the above-described organic substances. The concentration of the organic substance is not particularly limited, and whether the concentration is high or low does not matter essentially. The higher the concentration of the organic substance, and the longer the contact time of the carrier with the solvent in which the above-described organic substance is dissolved, the thickness of the organic substance in the intermediate layer tends to be larger.

Further, for example, the intermediate layer can be configured by laminating a nickel, and a molybdenum or cobalt or molybdenum-cobalt alloy, in that order, on a carrier. Since the adhesive strength between nickel and copper is higher than the adhesive strength between molybdenum or cobalt and copper, when the ultrathin copper layer is peeled off, the peeling occurs at the interface between the ultrathin copper layer and the molybdenum or cobalt or molybdenum-cobalt alloy. Further, the nickel in the intermediate layer is expected to provide a barrier effect that prevents the diffusion of the copper component from the carrier into the ultrathin copper layer.

In the intermediate layer, the amount of nickel deposited is 100 to 40,000 $μg/dm^2$; the amount of molybdenum deposited is 10 to 1,000 $μg/dm^2$; and the amount of cobalt deposited is 10 to 1,000 $μg/dm^2$. As described above, in the copper foil provided with a carrier according to the present invention, the amount of Ni on the surface of the ultrathin copper layer after peeling the ultrathin copper layer from the copper foil provided with a carrier is controlled. In order to control the amount of Ni on the ultrathin copper layer surface after peeling in this way, preferably the amount of Ni deposited in the intermediate layer is reduced and the intermediate layer contains a metal species (Co, Mo) which suppresses the diffusion of Ni into the ultrathin copper layer side. From this perspective, the amount of nickel deposited is preferably 100 to 40,000 $μg/dm^2$, preferably 200 to 20,000 $μg/dm^2$, more preferably 300 to 15,000 $μg/dm^2$, and more preferably 300 to 10,000 $μg/dm^2$. In the case that the intermediate layer contains molybdenum, the amount of molybdenum deposited is preferably 10 to 1,000 $μg/dm^2$ and the amount of molybdenum deposited is preferably 20 to 600 $μg/dm^2$, and more preferably 30 to 400 $μg/dm^2$. In the case that the intermediate layer contains cobalt, the amount of cobalt deposited is preferably 10 to 1,000 $μg/dm^2$ and the amount of cobalt deposited is preferably 20 to 600 $μg/dm^2$, and more preferably 30 to 400 $μg/dm^2$.

As described above, in the case that the intermediate layer has a configuration in which a nickel, and a molybdenum or cobalt or molybdenum-cobalt alloy are laminated in that order on a carrier, the density of the molybdenum or cobalt or molybdenum-cobalt alloy layer tends to be increased when the current density is lowered and the conveying speed of the carrier is lowered in a plating treatment to provide the molybdenum or cobalt or molybdenum-cobalt alloy layer. If the density of the layer containing molybdenum and/or cobalt is high, the nickel in the nickel layer is less likely to diffuse, which enables to control the amount of Ni on the ultrathin copper layer surface after peeling.

The intermediate layer can be provided by performing for a carrier a wet plating such as an electroplating, an electroless plating, and an immersion plating, or a dry plating such as a sputtering, a CVD, and a PVD. In the case that the intermediate layer is provided by using a wet plating with a resin film for a carrier, it is necessary to perform a pretreatment such as an activation treatment for subjecting the carrier to a wet plating before formation of the intermediate layer. The above-described pretreatment which can be used may be any treatment as long as it enables to perform a wet plating for a resin film, and known treatments can be used.

Strike Plating

An ultrathin copper layer is provided above the intermediate layer. Before it, strike plating may be carried out with a copper-phosphorous alloy to reduce the number of pinholes in the ultrathin copper layer. For the strike plating, a copper pyrophosphate solution and the like may be used.

Ultrathin Copper Layer

An ultrathin copper layer is provided above the intermediate layer. Here, another layer may also be provided between the intermediate layer and the ultrathin copper layer. The ultrathin copper layer can be formed through an electroplating utilizing an electrolytic bath of copper sulfate, copper pyrophosphate, copper sulfamate, copper cyanide, or the like, and a copper sulfate bath is preferred because it is used for a common electrolytic copper foil and enables to form a copper foil at a high current density. Although the thickness of the ultrathin copper layer is not particularly limited, the ultrathin copper layer is usually thinner than the carrier, and may be, for example, 12 μm or less. The thickness of the ultrathin copper layer is typically 0.05 to 12 μm, more typically 0.1 to 12 μm, 0.5 to 12 μm, more typically 1.5 to 5 μm, and more typically 2 to 5 μm. Further, a layer having a configuration which can be used as the intermediate layer may be used as the other layer.

Roughening Treatment for Ultrathin Copper Layer Surface and Carrier Surface

A roughened layer may be provided on the surface of the carrier opposite to the ultrathin copper layer side by performing a roughening treatment in order to make the close adhesion properties to a resin substrate good, for example. According to such a configuration, in laminating the copper foil provided with a carrier according to the present invention on a resin substrate from the carrier side, the close adhesion properties between the carrier and the resin substrate is improved and the carrier and the resin substrate are less likely to be peel apart in a step of fabricating a printed wiring board.

Alternatively, no roughened layer may be formed on the surface of the carrier opposite to the ultrathin copper layer side. In the case that no roughened layer is formed on the surface of the carrier opposite to the ultrathin copper layer side, there is an advantage that it is easier to control the peel strength between the carrier and the ultrathin copper layer.

Alternatively, a roughened layer may be provided on the surface of the ultrathin copper layer by performing a roughening treatment in order to make the close adhesion properties to an insulating substrate good, for example.

In the present invention, "surface of the carrier opposite to the ultrathin copper layer" on which a roughened layer, a heat resistant layer, an anti-corrosion layer, a chromate-treated layer, a silane coupling-treated layer, or the like is to be formed or on which no roughened layer is formed is not particularly limited as long as the surface is located opposite to the ultrathin copper layer across the carrier. For example, the surface of the carrier opposite to the ultrathin copper layer may be the surface of the carrier itself, or in the case that a surface-treated layer is formed on the carrier opposite to the ultrathin copper layer, may be the surface of any of layers in the surface-treated layer (including the surface of the outermost layer).

The roughening treatment performed for the carrier or the ultrathin copper layer can be carried out by forming roughened particles with copper or a copper alloy, for example. The roughening treatment may be a fine treatment. The roughened layer may be a layer consisting of a simple substance selected from the group consisting of copper, nickel, cobalt, phosphorous, tungsten, arsenic, molybdenum, chromium, and zinc or an alloy containing one or more thereof, or the like. Alternatively, after forming roughened particles with copper or a copper alloy, a roughening treatment can be carried out in which secondary particles or tertiary particles are further provided using a simple substance of nickel, cobalt, copper, or zinc, an alloy thereof, or the like. Further, the roughened layer may be formed using a sulfuric acid-copper sulfate electrolytic bath containing one or more selected from the group consisting of a sulfuric acid alkyl ester salt, tungsten, and arsenic. The roughening treatment can be performed using the following electrolytic bath under the following conditions. Furthermore, cover plating may be performed after the roughening treatment in order to prevent the roughened particle from being peeled out.

Roughening Treatment
(Solution Composition)
Cu: 10 to 30 g/L
$H_2SO_4$: 10 to 150 g/L
W: 0 to 50 mg/L
Sodium dodecyl sulfate: 0 to 50 mg/L
As: 0 to 200 mg/L
(Electroplating Conditions)
Temperature: 30 to 70° C.
Current density: 25 to 110 A/dm$^2$
Quantity of coulomb for roughening: 50 to 500 As/dm$^2$
Plating time: 0.5 to 20 seconds
Cover Plating
(Solution Composition)
Cu: 20 to 80 g/L
$H_2SO_4$: 50 to 200 g/L
(Electroplating Conditions)
Temperature: 30 to 70° C.
Current density: 5 to 50 A/dm$^2$
Quantity of coulomb for roughening: 50 to 300 As/dm$^2$
Plating time: 1 to 60 seconds Thereafter, a heat resistant layer or an anti-corrosion layer may be formed with a simple substance of nickel, cobalt, copper, or zinc, an alloy thereof, or the like, and further for the surface a treatment such as a chromate treatment and a silane coupling treatment may be performed. Alternatively, after a heat resistant layer or an anti-corrosion layer is formed with a simple substance of nickel, cobalt, copper, or zinc, an alloy thereof, or the like without performing a roughening treatment, further for the surface a treatment such as a chromate treatment and a silane coupling treatment may be performed. That is, one or more layers selected from the group consisting of a heat resistant layer, an anti-corrosion layer, a chromate-treated layer, and a silane coupling-treated layer may be formed on the surface of the roughened layer, or one or more layers selected from the group consisting of a heat resistant layer, an anti-corrosion layer, a chromate-treated layer, and a silane coupling-treated layer may be formed on the surface of the carrier or the ultrathin copper layer. The above-described heat resistant layer, anti-corrosion layer, chromate-treated layer, and silane coupling-treated layer may be each formed in a plurality of layers (e.g., two or more layers, three or more layers, or the like). These surface treatments have little influence on the surface roughness of the carrier and the ultrathin copper layer.

The roughening treatment can be carried out by forming roughened particles with copper or a copper alloy, for example. Preferably, fine particles constitute the roughened layer from the perspective of formation of a fine pitch. As for the electroplating conditions in forming roughened particles, a high current density, a low copper concentration in the plating solution, or a large quantity of coulomb tends to make the particles fine.

Printed Wiring Board and Laminate

For example, a laminate (e.g., a copper-clad laminate) can be produced by pasting a copper foil provided with a carrier on an insulating resin sheet from the ultrathin copper layer side followed by heating and pressure-bonding, and then peeling off the carrier. Further thereafter, the ultrathin copper layer portion can be etched to form a copper circuit for a printed wiring board. The insulating resin sheet to be used here is not especially limited as long as the insulating resin sheet has properties that allow to it to be applied in a printed wiring board. Examples that can be used include, for a rigid PWB, a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, and for an FPC, a polyester film and a polyimide film. The printed wiring board or the laminate produced in this way can be mounted on various electronic components for which high-density implementation of mounted components is required.

Note that, in the present invention, a "printed wiring board" includes a printed wiring board with components equipped thereon and a printed circuit board and a printed substrate. In addition, an electronic device can be fabricated using such a printed wiring board. Note that, in the present invention, a "copper circuit" includes a copper wiring.

Further, the copper foil provided with a carrier may be provided with a roughened layer above the ultrathin copper layer, and may be provided with one or more layers selected from the group consisting of a heat resistant layer, an anti-corrosion layer, a chromate-treated layer, and a silane coupling-treated layer above the roughened layer.

Furthermore, the copper foil provided with a carrier may be provided with a roughened layer above the ultrathin copper layer, and may be provided with a heat resistant layer or anti-corrosion layer above the roughened layer, and may be provided with a chromate-treated layer above the heat resistant layer or anti-corrosion layer, and may be provided with a silane coupling-treated layer above the chromate-treated layer.

Alternatively, the copper foil provided with a carrier may be provided with a resin layer above the ultrathin copper layer, or above the roughened layer, or above the heat resistant layer or anti-corrosion layer, or a chromate-treated layer, or a silane coupling-treated layer.

The above-described resin layer may be an adhesive, and may also be an insulating resin layer in a semi-cured state (B stage state) for adhesion. This semi-cured state (B stage state) includes states in which there is no stickiness feeling even if the surface is touched with a finger, the insulating resin layer can be stacked and stored, and a curing reaction occurs when further subjected to a heating treatment.

Further, the above-described resin layer may include a thermosetting resin, or may be a thermoplastic resin. In addition, the above-described resin layer may include a thermoplastic resin. This resin layer may include known resins, resin curing agents, compounds, curing accelerators, dielectrics, reaction catalysts, cross-linking agents, polymers, prepregs, skeletal materials, and the like. Still further, the resin layer may be formed using the substances (resins, resin curing agents, compounds, curing accelerators, dielectrics, reaction catalysts, cross-linking agents, polymers, prepregs, skeletal materials, and the like) and/or resin layer formation method and formation apparatus described in International Publication No. WO 2008/004399, International Publication No. WO 2008/053878, International Publication No. WO 2009/084533, Japanese Patent Laid-Open No. 1999-5828, Japanese Patent Laid-Open No. 1999-140281, Japanese Patent No. 3184485, International Publication No. WO 97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO 2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO 2006/028207, Japanese Patent No. 4828427, Japanese Patent Laid-Open No. 2009-67029, International Publication No. WO 2006/134868, Japanese Patent No. 5046927, Japanese Patent Laid-Open No. 2009-173017, International Publication No. WO 2007/105635, Japanese Patent No. 5180815, International Publication No. WO 2008/114858, International Publication No. WO 2009/008471, Japanese Patent Laid-Open No. 2011-14727, International Publication No. WO 2009/001850, International Publication No. WO 2009/145179, International Publication No. WO 2011/068157, Japanese Patent Laid-Open No. 2013-19056.

Further, the type of the above-described resin layer is not especially limited. Examples of preferred resins can include one or more selected from the group consisting of epoxy resins, polyimide resins, polyfunctional cyanate compounds, maleimide compounds, polymaleimide compounds, maleimide resins, aromatic maleimide resins, polyvinyl acetal resins, urethane resins, polyether sulfone (also called polyether sulphone), polyether sulfone (also called polyether sulphone) resins, aromatic polyamide resins, aromatic polyamide resin polymers, rubber resins, polyamines, aromatic polyamines, polyamide-imide resins, rubber-modified epoxy resins, phenoxy resins, carboxyl group-modified acrylonitrile-butadiene resins, polyphenylene oxide, bismaleimide triazine resins, thermosetting polyphenylene oxide resins, cyanate ester resins, carboxylic acid anhydrides, polybasic carboxylic acid anhydrides, linear polymers having a cross-linkable functional group, polyphenylene ether resins, 2,2-bis(4-cyanatophenyl)propane, phosphorus-containing phenol compounds, manganese naphthenate, 2,2-bis(4-glycidylphenyl)propane, polyphenylene ether-cyanate resins, siloxane-modified polyamide-imide resins, cyano ester resins, phosphazene resins, rubber-modified polyamide-imide resins, isoprene, hydrogenated polybutadiene, polyvinyl butyral, phenoxy, high-molecular-weight epoxys, aromatic polyamides, fluororesins, bisphenol, polyimide block copolymer resins, and cyano ester resins.

In addition, the above-described epoxy resin can be used without any particular problem as long as it has two or more epoxy groups in the molecule and can be used in electrical/electronic material applications. Moreover, an epoxy resin epoxied using a compound having two or more glycidyl groups in the molecule is preferred. Further examples of epoxy resins that can be used include one or a mixture of two or more selected from the group consisting of bisphenol A type epoxy resins, bisphenol F type epoxy resins, bisphenol S type epoxy resins, bisphenol AD type epoxy resins, novolak type epoxy resins, cresol novolak type epoxy resins, alicyclic epoxy resins, brominated epoxy resins, phenol novolak type epoxy resins, naphthalene type epoxy resins, brominated bisphenol A type epoxy resins, ortho-cresol novolak type epoxy resins, rubber-modified bisphenol A type epoxy resins, glycidyl amine compounds such as glycidyl amine type epoxy resins, triglycidyl isocyanurate, and N,N-diglycidyl aniline, glycidyl ester compounds such as diglycidyl tetrahydrophthalate, phosphorus-containing epoxy resins, biphenyl type epoxy resins, biphenyl novolak type epoxy resins, tris(hydroxyphenyl)methane type epoxy resins, and tetraphenylethane type epoxy resins. Also, a hydrogenated product or a halide of the above-described epoxy resins may be used.

A known phosphorus-containing epoxy resin can be used for the above-described phosphorus-containing epoxy resin. Further, it is preferred that the above-described phosphorus-containing epoxy resin is an epoxy resin obtained as a derivative from, for example, 9,10-dihydro-9-oxa-10-phosphaphenanthrene-10-oxide that includes two or more epoxy groups in the molecule.

In the Case that the Resin Layer Includes a Dielectric (Dielectric Filler)

The resin layer may include a dielectric filler.

In the case that a dielectric (dielectric filler) is included in any of the above resin layers or resin compositions, the dielectric is used for an application of forming a capacitor layer and thereby enables to increase the capacitance of a capacitor circuit. As this dielectric (dielectric filler), a dielectric powder of a complex oxide having a perovskite structure such as $BaTiO_3$, $SrTiO_3$, $Pb(Zr-Ti)O_3$ (commonly called PZT), $PbLaTiO_3.PbLaZrO$ (commonly called PLZT), and $SrBi_2Ta_2O_9$ (commonly called SBT).

The resin and/or resin composition and/or compound included in the above-described resin layer is obtained in a B stage state by, for example, dissolving in a solvent such as methyl ethyl ketone (MEK), cyclopentanone, dimethylformamide, dimethylacetamide, N-methylpyrrolidone, toluene, methanol, ethanol, propylene glycol monomethyl ether, dimethylformamide, dimethylacetamide, cyclohexanone, ethyl cellosolve, N-methyl-2-pyrrolidone, N,N-dimethylacetamide, N,N-dimethylformamide to produce a resin solution (resin varnish), coating the resin solution on the surface on the ultrathin copper layer side of the copper foil provided with a carrier by a roll coater method, for example, and then heating and drying as necessary to remove the solvent. The drying can be carried out using, for example, a hot air drying furnace, at a drying temperature of 100 to 250° C., and preferably 130 to 200° C. The composition of the above-described resin layer may be dissolved using a solvent to obtain the resin solution having a resin solid content of 3% by weight to 70% by weight, preferably 3% by weight to 60% by weight, preferably 10% by weight to 40% by weight, and more preferably 25% by weight to 40% by weight. Further, from an environmental standpoint, at the current point it is most preferred to dissolve using a mixed solvent of methyl ethyl ketone and cyclopentanone. In addition, it is preferred to use as the solvent a solvent having a boiling point in the range of 50° C. to 200° C.

Still further, it is preferred that the above-described resin layer is a semi-cured resin film having a resin flow when measured based on MIL-P-13949G in the MIL standards in the range of 5% to 35%.

In the present specification, the resin flow is a value obtained by, based on MIL-P-13949G in the MIL standards, sampling four 10-cm square specimens from a surface-treated copper foil provided with a resin having a resin thickness of pasting the four specimens in a stacked state (as a laminate) under conditions of a pressing temperature of 171° C., a pressing pressure of 14 kgf/cm$^2$, and a pressing time of 10 minutes, and calculating the resin flow weight at that point from the measured results based on the following formula.

$$\text{Resin flow}(\%) = \frac{\text{Resin flow weight}}{(\text{Laminate weight}) - (\text{Copper foil weight})} \times 100$$

The surface-treated copper foil (surface-treated copper foil provided with a resin) including the above-described resin layer is used in a mode for forming a predetermined wiring pattern from the surface on the opposite side to the side subjected to the roughening treatment of the surface-treated copper foil by stacking the resin layer on the base material, then heating and pressure-bonding the whole stack to thermally cure the resin layer, and if the surface-treated copper foil is an ultrathin copper layer of a copper foil provided with a carrier, then peeling the carrier to expose the ultrathin copper layer to the surface (naturally the exposed portion is the surface on the intermediate layer side of the ultrathin copper layer).

If this surface-treated copper foil provided with a resin is used, the number of sheets of prepreg material used when fabricating a multilayer printed wiring board can be reduced. Moreover, the thickness of the resin layer can be set to a thickness that ensures interlayer insulation, and a copper-clad laminate can be fabricated even without using a prepreg material at all. Further, at this point, the smoothness of the surface can be further improved by applying an insulating resin as an undercoat on the surface of the base material.

Further, not using a prepreg material has the economic advantages that the costs of the prepreg material can be saved, and the lamination step can be simplified. Moreover, there is also the advantage that the thickness of the multilayer printed wiring board to be fabricated is thinner by the thickness amount of the prepreg material, so that a very thin multilayer printed wiring board in which the thickness of one layer is 100 μm or less can be fabricated.

The thickness of this resin layer is preferably 0.1 to 500 μm more preferably 0.1 to 300 μm, more preferably 0.1 to 200 μm, and more preferably 0.1 to 120 μm.

If the thickness of the resin layer is thinner than 0.1 μm the adhesive strength can deteriorate, and it can become difficult to ensure interlayer insulation between an inner layer material and the circuit when this copper foil provided with a carrier provided with a resin is laminated on a base material including an inner layer material without arranging a prepreg material therebetween. On the other hand, if the resin layer thickness is thicker than 120 μm, it can be difficult to form a resin layer with a target thickness in one coating step, so that extra material costs and steps are required, which is economically disadvantageous.

Further, when the copper foil provided with a carrier having a resin layer is used to fabricate a very thin multilayer printed wiring board, it is preferred that the thickness of the above-described resin layer is 0.1 μm to 5 μm, more preferably 0.5 μm to 5 μm, and more preferably 1 μm to 5 μm, because the thickness of the multilayer printed wiring board is smaller.

Further, in the case that the thickness of the resin layer is 0.1 μm to 5 μm, it is preferred to provide a heat resistant layer and/or an anti-corrosion layer and/or a chromate-treated layer and/or a silane coupling-treated layer above the ultrathin copper layer and thereafter form a resin layer above the heat resistant layer or the anti-corrosion layer or the chromate-treated layer or the silane coupling-treated layer in order to improve the close adhesion properties between the resin layer and the copper foil provided with a carrier.

Here, the above-described thickness of a resin layer is the average value of thicknesses measured by cross-sectional observation at arbitrary 10 points.

In addition, regarding another product form of this copper foil provided with a carrier provided with a resin, it is also possible to cover the top of the ultrathin copper layer, or the roughened layer, the heat resistant layer, the anti-corrosion layer, or the chromate-treated layer, or the silane coupling-treated layer with a resin layer, which is then semi-cured, and thereafter peel off the carrier to fabricate a copper foil provided with a resin without a carrier.

Method for Fabricating Printed Wiring Board

An embodiment of the method for fabricating a printed wiring board according to the present invention includes forming a copper-clad laminate by carrying out a step of preparing the copper foil provided with a carrier according to the present invention and an insulating substrate, a step of laminating the copper foil provided with a carrier and the insulating substrate, and a step of, after the copper foil provided with a carrier and the insulating substrate have been laminated in such a manner that the ultrathin copper layer side of the copper foil faces the insulating substrate, peeling the carrier of the copper foil provided with a carrier, and then forming a circuit by any of a semi-additive method, a modified semi-additive method, a partly additive method, and a subtractive method. The insulating substrate can also be formed between the inner layer circuits.

In the present invention, semi-additive method refers to a method for forming a pattern by performing thin electroless plating on an insulating substrate or a copper foil seed layer, and then forming a conductive pattern using electrolytic plating and etching.

Therefore, an embodiment of a method for fabricating a printed wiring board according to the present invention using a semi-additive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of removing all of an ultrathin copper layer exposed by the peeling of the carrier by a method such as plasma or etching using a corrosive solution such as an acid, a step of providing a through-hole and/or a blind via on a resin exposed by removal of the ultrathin copper layer by etching, a step of performing a desmearing treatment on a region including the through-hole and/or blind via, a step of providing an electroless plating layer for a region including the resin and the through-hole and/or blind via, a step of providing a plating resist on the electroless plating layer, a step of exposing the plating resist and then removing the plating resist in a region where a circuit is formed, a step of providing an electrolytic plating layer on the region where the circuit is formed from which the plating resist has been removed, a step of removing the plating resist, and a step of removing the electroless plating layer in regions other than where the circuit is formed by flash etching and the like.

Another embodiment of a method for fabricating a printed wiring board according to the present invention using a semi-additive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of removing all of an ultrathin copper layer exposed by the peeling of the carrier by a method such as plasma or etching using a corrosive solution such as an acid, a step of providing an electroless plating layer for a surface of a resin exposed by removal of the ultrathin copper layer by etching, a step of providing a plating resist on the electroless plating layer, a step of exposing the plating resist and then removing the plating resist in a region where a circuit is formed, a step of providing an electrolytic plating layer on the region where the circuit is formed from which the plating resist has been removed, a step of removing the plating resist, and a step of removing the electroless plating layer and ultrathin copper layer in regions other than where the circuit is formed by flash etching and the like.

In the present invention, modified semi-additive method refers to a method for forming a circuit on an insulating layer by laminating a metal foil on an insulating layer, protecting a non-circuit formed portion with a plating resist, performing copper thickening of a circuit formed portion by electrolytic plating, then removing the resist, and removing the metal foil at portions other than the circuit formed portion by (flash) etching.

Therefore, an embodiment of a method for fabricating a printed wiring board according to the present invention using a modified semi-additive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of providing a through-hole and/or a blind via on an ultrathin copper layer and the insulating substrate exposed by the peeling of the carrier, a step of performing a desmearing treatment on a region including the through-hole and/or blind via, a step of providing an electroless plating layer for the region including the through-hole and/or blind via, a step of providing a plating resist on an ultrathin copper layer surface exposed by the peeling of the carrier, a step of, after providing the plating resist, forming a circuit by electrolytic plating, a step of removing the plating resist, and a step of removing the ultrathin copper layer exposed by the removal of the plating resist.

Another embodiment of a method for fabricating a printed wiring board according to the present invention using a modified semi-additive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of providing a plating resist on an ultrathin copper layer exposed by the peeling of the carrier, a step of exposing the plating resist and then removing the plating resist in a region where a circuit is formed, a step of providing an electrolytic plating layer on the region where the circuit is formed from which the plating resist has been removed, a step of removing the plating resist, and a step of removing the electroless plating layer and ultrathin copper layer in regions other than where the circuit is formed by flash etching and the like.

In the present invention, partly additive method refers to a method for fabricating a printed wiring board by providing a catalyst core on a substrate that is provided with a conductive layer and in which holes for through-holes and via holes have optionally been opened, forming a conductive circuit by etching, optionally providing a solder resist or a plating resist, and then performing thickening on the conductive circuit by an electroless plating treatment on the through-holes, via holes, and the like.

Therefore, an embodiment of a method for fabricating a printed wiring board according to the present invention using a partly additive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of providing a through-hole and/or a blind via on an ultrathin copper layer and the insulating substrate exposed by the peeling of the carrier, a step of performing a desmearing treatment on a region including the through-hole and/or blind via, a step of providing a catalyst core for the region including the through-hole and/or blind via, a step of providing an etching resist on an ultrathin copper layer surface exposed by the peeling of the carrier, a step of exposing the etching resist to form a circuit pattern, a step of forming a circuit by removing the ultrathin copper layer and the catalyst core by a method such as plasma or etching using a corrosive solution such as an acid, a step of removing the etching resist, a step of providing a solder resist or a plating resist on the insulating substrate surface exposed by removing the ultrathin copper layer and the catalyst core by a method such as plasma or etching using a corrosive solution such as an acid, and a step of providing an electroless plating layer in regions where the solder resist or the plating resist is not provided.

In the present invention, subtractive method refers to a method for forming a conductive pattern by selectively removing an unnecessary portion of copper foil on a copper-clad laminate by etching and the like.

Therefore, an embodiment of a method for fabricating a printed wiring board according to the present invention using a subtractive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of providing a through-hole and/or a blind via on an ultrathin copper layer and the insulating substrate exposed by the peeling of the carrier, a step of performing a desmearing treatment on a region including the through-hole and/or blind via, a step of providing an electroless plating layer for the region including the through-hole and/or blind via, a step of providing an electrolytic plating layer on a surface of the electroless plating layer, a step of providing an etching resist on a surface of the electrolytic plating layer and/or the ultrathin copper layer, a step of exposing the etching resist to form a circuit pattern, a step of forming a circuit by removing the ultrathin copper layer, the electroless plating layer, and the electrolytic plating layer by a method such as plasma or etching using a corrosive solution such as an acid, and a step of removing the etching resist.

Another embodiment of a method for fabricating a printed wiring board according to the present invention using a subtractive method includes a step of preparing the copper foil provided with a carrier according to the present invention and an insulating substrate, a step of laminating the copper foil provided with a carrier and the insulating substrate, a step of, after the copper foil provided with a carrier and the insulating substrate have been laminated, peeling the carrier of the copper foil provided with a carrier, a step of providing a through-hole and/or a blind via on an ultrathin copper layer and the insulating substrate exposed by the peeling of the carrier, a step of performing a desmearing treatment on a region including the through-hole and/or blind via, a step of providing an electroless plating layer for the region including the through-hole and/or blind via, a step of forming a mask on a surface of the electroless plating layer, a step of providing an electrolytic plating layer on a surface of the electroless plating layer on which the mask is not formed, a step of providing an etching resist on a surface of the electrolytic plating layer and/or the ultrathin copper layer, a step of exposing the etching resist to form a circuit pattern, a step of forming a circuit by removing the ultrathin copper layer and the electroless plating layer by a method such as plasma or etching using a corrosive solution such as an acid, and a step of removing the etching resist.

The step of providing a through-hole and/or a blind via and the subsequent desmearing step do not have to be carried out.

Here, specific examples of the method for fabricating a printed wiring board using the copper foil provided with a carrier according to the present invention will now be described with reference to the drawings.

First, as illustrated in FIG. 2A, a copper foil provided with a carrier (first layer) having an ultrathin copper layer on which a roughened layer has been formed on the surface is prepared.

Next, as illustrated in FIG. 2B, a resist is coated on the roughened layer of the ultrathin copper layer, exposure and development is carried out, and the resist is etched into a predetermined shape.

Next, as illustrated in FIG. 2C, a plating for a circuit is formed, and then the circuit plating is formed in a predetermined shape by removing the resist.

Figure 3D:
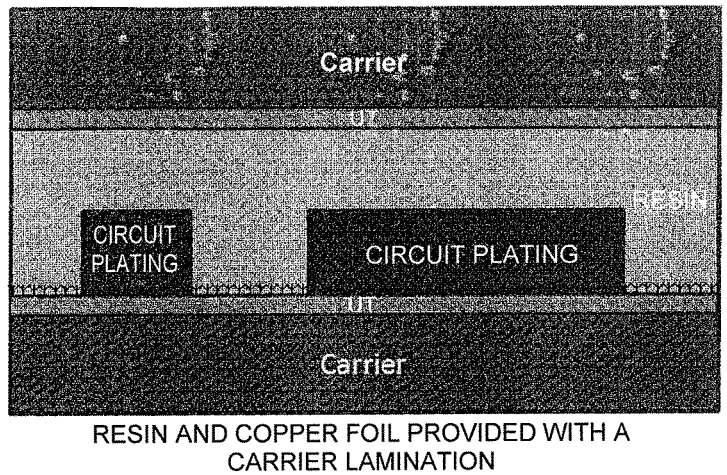
FIGS. 3D to 3F are schematic views of a circuit board cross-section during steps from lamination of a resin and a second layer of a copper foil provided with a carrier until laser hole opening according to a specific example of the method for fabricating a printed wiring board using the copper foil provided with a carrier according to the present invention.

Next, as illustrated in FIG. 3D, a resin layer is laminated by providing an embedded resin on the ultrathin copper layer so as to cover the circuit plating (so as to bury the circuit plating), and then a separate copper foil provided with a carrier (second layer) is adhered from the ultrathin copper layer side.

Figure 3E:
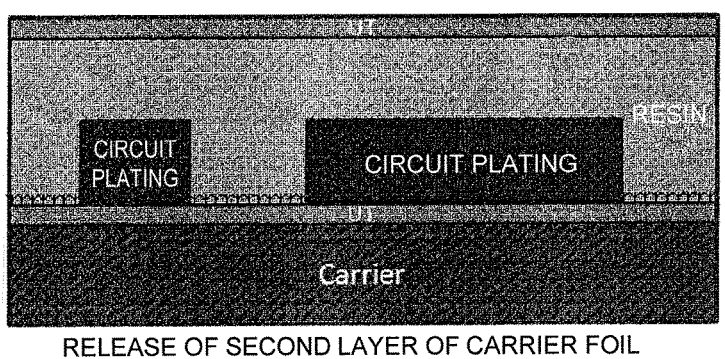

Next, as illustrated in FIG. 3E, the carrier is peeled from the second layer of the copper foil provided with a carrier.

Figure 3F:
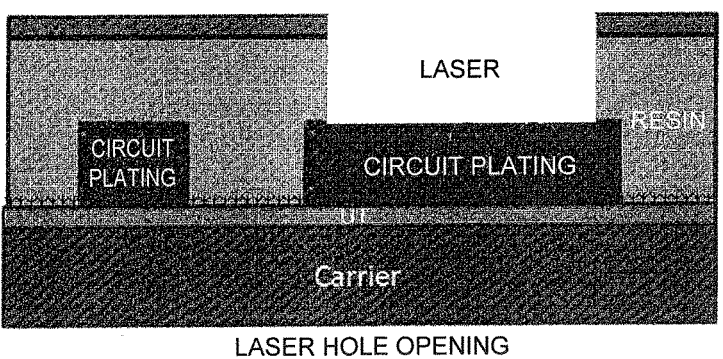

Next, as illustrated in FIG. 3F, laser hole opening is performed on a predetermined position of the resin layer, and the circuit plating is exposed to form a blind via.

Figure 4G:
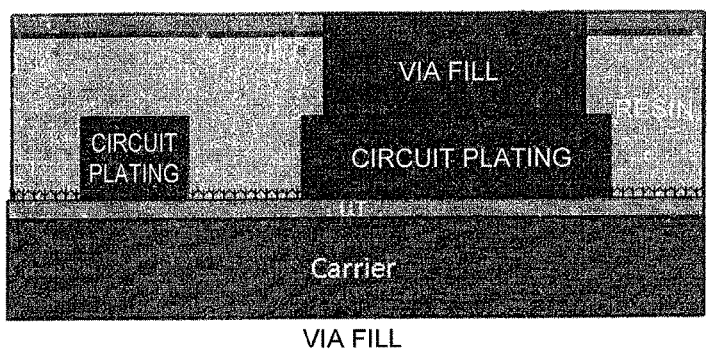
FIGS. 4G to 4I are schematic views of a circuit board cross-section during steps from via fill formation until peeling of the first carrier layer according to a specific example of the method for fabricating a printed wiring board using the copper foil provided with a carrier according to the present invention.

Next, as illustrated in FIG. 4G, copper is embedded in the blind via to form a via fill.

Figure 4H:
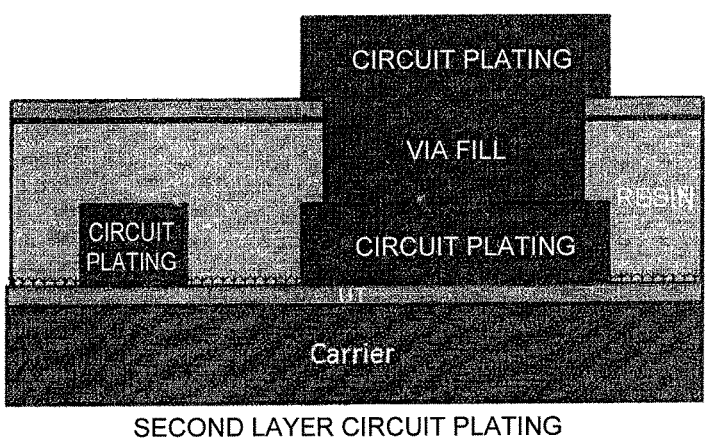

Next, as illustrated in FIG. 4H, a circuit plating is formed as illustrated in the above-described FIGS. 2B and 2C on the via fill.

Figure 4I:
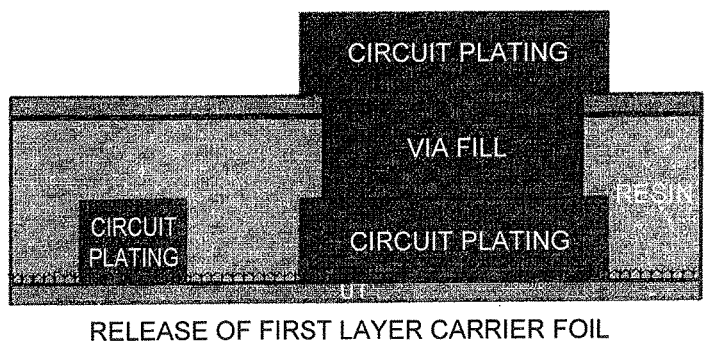

Next, as illustrated in FIG. 4I, the carrier is peeled from the first layer of the copper foil provided with a carrier.

Figure 5J:
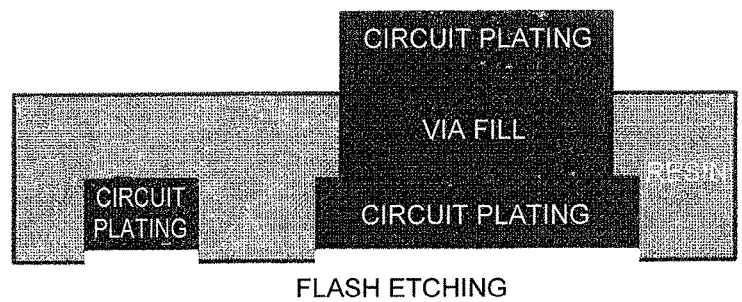
FIGS. 5J to 5K are schematic views of a circuit board cross-section during steps from flash etching until bump and copper pillar formation according to a specific example of the method for fabricating a printed wiring board using the copper foil provided with a carrier according to the present invention.

Next, as illustrated in FIG. 5J, the ultrathin copper layer on both surfaces is removed by flash etching to expose the surface of the circuit plating in the resin layer.

Figure 5K:
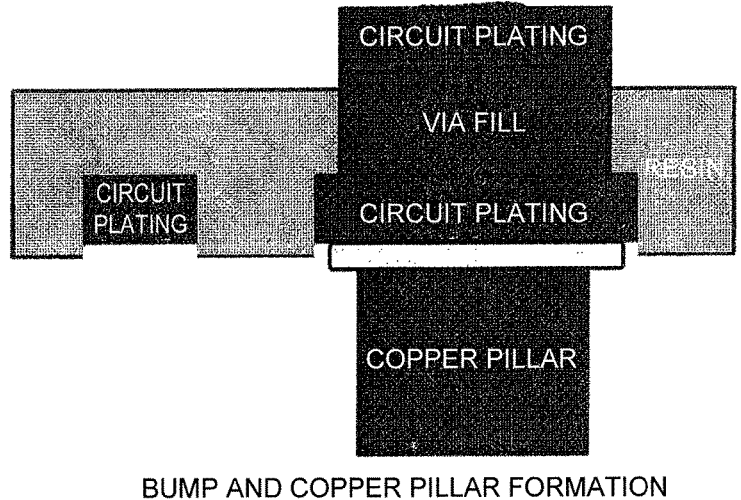

Next, as illustrated in FIG. 5K, a bump is formed on the circuit plating in the resin layer, and a copper pillar is formed on that solder. In this manner, a printed wiring board using the copper foil provided with a carrier according to the present invention is produced.

For the above-described separate copper foil provided with a carrier (second layer), the copper foil provided with a carrier according to the present invention can be used, a conventional copper foil provided with a carrier may be used, or a normal copper foil may be used. Further, a circuit may be formed in one layer or a plurality of layers on the circuit of the second layer illustrated in FIG. 4H. These circuits can be formed by any of a semi-additive method, a subtractive method, a partly additive method, and a modified semi-additive method.

Further, the copper foil provided with a carrier used for the first layer may have a substrate on the carrier side surface of the copper foil provided with a carrier. By having the substrate or a resin layer, the copper foil provided with a carrier used for the first layer is supported, so that wrinkles are less likely to form. Consequently, there is the advantage that productivity is improved. Moreover, any substrate may be used for this substrate, as long as the substrate has an effect of supporting the above-described copper foil provided with a carrier used for the first layer. For example, the carrier, the prepreg, and the resin layer described in the specification of the present application, or a known carrier, prepreg, resin layer, metal sheet, metal foil, sheet of an inorganic compound, foil of an inorganic compound, sheet of an organic compound, or foil of an organic compound can be used as the above-described substrate.

Although the timing to form a substrate on the carrier side surface is not particularly limited, it is necessary to form a substrate before peeling off the carrier. In particular, it is preferred to form a substrate before a step of forming a resin layer on the ultrathin copper layer side surface of the copper foil provided with a carrier, and it is more preferred to form a substrate before a step of forming a circuit on the ultrathin copper layer side surface of the copper foil provided with a carrier.

In the copper foil provided with a carrier according to the present invention, the color difference $\Delta E^*ab$ based on JIS Z8730 when the reference color is defined as the object color of a white board of the ultrathin copper layer surface (when the light source is set to D65 and the view angle is set to 10 degrees, the tristimulus values of the white board in the $X_{10}Y_{10}Z_{10}$ color system (JIS Z8701 1999) are $X_{10}=80.7$, $Y_{10}=85.6$, $Z_{10}=91.5$, and the object color of the white board in an L*a*b* color system is L*=94.14, a*=−0.90, b*=0.24), is preferably controlled to satisfy 45 or more. The above-described $\Delta E^*ab$ is preferably 50 or more, more preferably 55 or more, and even more preferably 60 or more. If the color difference $\Delta E^*ab$ based on JIS Z8730 of the ultrathin copper layer surface is 45 or more, for example, when forming a circuit on the ultrathin copper layer surface of the copper foil provided with a carrier, the contrast between the ultrathin copper layer and the circuit becomes very clear, so that as a result visibility is good and the positioning of the circuit can be carried out precisely. In the present invention, "color difference of the ultrathin copper layer surface" refers to the color difference of the surface of the ultrathin copper layer, or, in the case that various surface-treated layers have been provided, such as a roughened layer, a heat resistant layer, an anti-corrosion layer, a chromate-treated layer, and a silane coupling-treated layer, the color difference of the surface of that surface-treated layer (outermost surface).

The above-described color difference $\Delta E^*ab$ is represented by the following equation. Here, the color differences $\Delta L$, $\Delta a$, and $\Delta b$ in the following equation are each measured with a colorimeter. These color differences are a general index represented using an L*a*b* color system based on JIS Z8730 (2009) tinted with black/white/red/green/yellow/blue, in which $\Delta L$ is represented as white/black, $\Delta a$ as red/green, and $\Delta b$ as yellow/blue. For example, the color differences ($\Delta L$, $\Delta a$, $\Delta b$) can be measured using the colorimeter MiniScan XE Plus manufactured by HunterLab. Note that the color differences $\Delta L$, $\Delta a$, $\Delta b$ are each a color difference based on JIS Z8730 (2009) of the ultrathin copper layer surface when the reference color is defined as the object color of the above-described white board, and $\Delta L$ is the difference of CIE luminosity L* between two object colors in an L*a*b* color system defined in JIS Z8729 (2004), and $\Delta a$ and $\Delta b$ are the difference of a color coordinate a* or b*, respectively, between two object colors in an L*a*b* color system defined in JIS Z8729 (2004).

$$\Delta E^*ab = \sqrt{\Delta L^2 + \Delta a^2 + \Delta b^2}$$

The above-described color difference can be adjusted by increasing the current density during ultrathin copper layer formation, reducing the copper concentration in the plating solution, and increasing the linear flow rate of the plating solution.

Further, the above-described color difference can also be adjusted by providing a roughened layer by performing a roughening treatment on the surface of the ultrathin copper layer. If a roughened layer is provided, the adjustment can be carried out using an electrolyte including copper and one or more elements selected from the group consisting of nickel, cobalt, tungsten, and molybdenum, increasing the current density higher than for a conventionally (e.g., to 40 to 60 A/dm$^2$), and shortening the treatment time (e.g., to 0.1 to 1.3 seconds). If a roughened layer is not provided on the surface of the ultrathin copper layer, the adjustment can be carried out using a plating bath that contains Ni in a concentration twice or more that of other elements, and performing Ni alloy plating (e.g., Ni—W alloy plating, Ni—Co—P alloy plating, and Ni—Zn alloy plating) on the surface of the ultrathin copper layer, or a heat resistant layer, or an anti-corrosion layer, or a chromate-treated layer, or a silane coupling-treated layer by setting a lower current density than conventionally (e.g., 0.1 to 1.3 A/dm$^2$) and a longer treatment time (e.g., 20 seconds to 40 seconds).

Moreover, a known resin and prepreg can be used for the buried resin. For example, a BT (bismaleimide triazine) resin, a glass cloth prepreg impregnated with a BT resin, an ABF film or ABF manufactured by Ajinomoto Fine-Techno Co., Inc., can be used. Further, the resin layer and/or resin and/or prepreg described in the present specification can be used for the above-described buried resin.

Further, the method for fabricating a printed wiring board according to the present invention may be a method for fabricating a printed wiring board including: a step of laminating the ultrathin copper layer side surface or the carrier side surface of the copper foil provided with a carrier according to the present invention and a resin substrate; a step of providing two layers of a resin layer and a circuit at least one time on the surface of the copper foil provided with a carrier opposite to the ultrathin copper layer side surface or the carrier side surface with the resin substrate laminated thereon; and a step of, after the two layers of the resin layer and the circuit have been formed, peeling the carrier or the ultrathin copper layer from the copper foil provided with a carrier (coreless method). In a specific example of the coreless method, first, the ultrathin copper layer side surface or the carrier side surface of the copper foil provided with a carrier according to the present invention and a resin substrate are laminated to fabricate a laminate. Subsequently, a resin layer is formed on the surface of the copper foil provided with a carrier opposite to the ultrathin copper layer side surface or the carrier side surface with the resin substrate laminated thereon. A separate copper foil provided with a carrier may be laminated from the carrier side or the ultrathin copper layer side on the resin layer formed on the carrier side surface or the ultrathin copper layer side surface. Further, a laminate having a configuration in which a copper foil provided with a carrier is laminated on both surfaces of the resin substrate, which is positioned at the center, in an order of a carrier/an intermediate layer/an ultrathin copper layer or an ultrathin copper layer/an intermediate layer/a carrier, or a laminate having a configuration in which "a carrier/an intermediate layer/an ultrathin copper layer/a resin substrate/an ultrathin copper layer/an intermediate layer/a carrier" are laminated in this order may be used for the above-described method for fabricating a printed wiring board (coreless method). In addition, on the exposed surface of the ultrathin copper layer or the carrier at both ends of the laminate, a separate resin layer may be further provided to form a circuit by further providing a copper layer or metal layer and thereafter processing the copper layer or metal layer. A separate resin layer may be further provided on the circuit so as to bury the circuit. Further, such formation of a circuit and a resin layer may be carried out one or more times (build-up method). And for the laminate formed in this way (hereinafter, also referred to as laminate B), a coreless substrate can be produced by peeling the ultrathin copper layer or the carrier of each copper foil provided with a carrier from the carrier or the ultrathin copper layer. For producing the above-described coreless substrate, two copper foils provided with a carrier can be used to produce a laminate having a configuration of an ultrathin copper layer/an intermediate layer/a carrier/a carrier/an intermediate layer/an ultrathin copper layer, a laminate having a configuration of a carrier/an intermediate layer/an ultrathin copper layer/an ultrathin copper layer/an intermediate layer/a carrier, or a laminate having a configuration of a carrier/an intermediate layer/an ultrathin copper layer/a carrier/an intermediate layer/an ultrathin copper layer as described below to use the laminate as the center. A coreless substrate can be produced by providing two layers of a resin layer and a circuit one or more times on surfaces of the ultrathin copper layers or the carriers on both sides of these laminates (hereinafter, also referred to as laminate A), and, after the two layers of the resin layer and the circuit have been provided, peeling the ultrathin copper layer or the carrier of each copper foil provided with a carrier from the carrier or the ultrathin copper layer. The above-described laminate may have another layer on the surface of the ultrathin copper layer, on the surface of the carrier, between the carriers, between the ultrathin copper layers, or between the ultrathin copper layer and the carrier. The other layer may be a resin layer or a resin substrate. In the present specification, in the case that an ultrathin copper layer, a carrier, or a laminate has another layer on the ultrathin copper layer surface, the carrier surface, or the laminate surface, "surface of an ultrathin copper layer," "ultrathin copper layer side surface," "ultrathin copper layer surface," "surface of a carrier," "carrier side surface," "carrier surface," "surface of a laminate," and "laminate surface" are a concept also including the surface (outermost surface) of the another layer. Further, the laminate preferably has a configuration of an ultrathin copper layer/an intermediate layer/a carrier/a carrier/an intermediate layer/an ultrathin copper layer. This is because, when a coreless substrate is produced using the laminate, the ultrathin copper layer is disposed on the coreless substrate side, which facilitates formation of a circuit on the coreless substrate using a modified semi-additive method. In addition, the reason is that, since the thickness of the ultrathin copper layer is small, it is easy to remove the ultrathin copper layer, which facilitates formation of a circuit on the coreless substrate using a semi-additive method after removing the ultrathin copper layer.

In the present specification, "laminate" which is not particularly stated as "laminate A" or "laminate B" indicates a laminate including at least a laminate A and a laminate B.

In the above-described method for fabricating a coreless substrate, when fabricating a printed wiring board using a build-up method, by covering a part or all of the edge face of the copper foil provided with a carrier or a laminate (laminate A) with a resin, the permeation of a chemical solution into the intermediate layer or a space between one copper foil provided with a carrier and another copper foil provided with a carrier constituting the laminate can be suppressed, and the separation of the ultrathin copper layer and the carrier and the corrosion of the copper foil provided with a carrier due to the permeation of a chemical solution can be prevented and yield can be improved. As the "resin covering a part or all of the edge face of the copper foil provided with a carrier" or the "resin covering a part or all of the edge face of the laminate" used here, a resin which can be used for the resin layer can be used. Further, in the above-described method for fabricating a coreless substrate, when the copper foil provided with a carrier or the laminate is viewed in a plane, at least a part of the periphery of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. Further, a laminate (laminate A) formed by using the above-described method for fabricating a coreless substrate may have a configuration in which a pair of copper foils provided with a carrier are contacted with each other in a separable manner. Furthermore, when the copper foil provided with a carrier is viewed in a plane, all of the periphery of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. By adopting such a configuration, when the copper foil provided with a carrier or the laminate is viewed in a plane, the laminated part of the copper foil provided with a carrier or the laminate is covered with a resin or a prepreg, and it can be prevented for another member to touch from the lateral direction of this part, that is, the transverse direction against the lamination direction, and as a result, the peeling of the carrier and the ultrathin copper layer or copper foils provided with a carrier can be less likely to occur in handling. Further, by covering the periphery of a laminated part of the copper foil provided with a carrier or the laminate with a resin or a prepreg so as not to expose it, the above-described permeation of a chemical solution into the interface of this laminated part in a chemical solution treatment step can be prevented, and the corrosion and erosion of the copper foil provided with a carrier can be prevented. It should be noted that, when one copper foil provided with a carrier is separated from a pair of copper foils provided with a carrier of the laminate or when the carrier and the copper foil (ultrathin copper layer) of the copper foil provided with a carrier are separated from each other, the laminated part of the copper foil provided with a carrier or the laminate (the laminated part of the carrier and the ultrathin copper layer, or the laminated part of one copper foil provided with a carrier and another copper foil provided with a carrier) covered with a resin or a prepreg needs to be removed by cutting or the like.

The copper foil provided with a carrier according to the present invention may be laminated from the carrier side or the ultrathin copper layer side on the carrier side or the ultrathin copper layer side of another copper foil provided with a carrier according to the present invention to constitute a laminate. Further, the laminate may be a laminate obtained by directly laminating as necessary via an adhesive the carrier side surface or the ultrathin copper layer side surface of the one copper foil provided with a carrier and the carrier side surface or the ultrathin copper layer side surface of the another copper foil provided with a carrier. Furthermore, the carrier or the ultrathin copper layer of the one copper foil provided with a carrier and the carrier or the ultrathin copper layer of the another copper foil provided with a carrier may be bonded together. Here, in the case that the carrier or the ultrathin copper layer has a surface-treated layer, the "bonding" includes a mode in which they are bonded together via the surface-treated layer. In addition, a part or all of the edge face of the laminate may be covered with a resin.

Lamination of carriers can be carried out by simply stacking or, for example, by using the following methods.

(a) metallurgical bonding method: fusion welding (arc welding, TIG (tungsten/inert gas) welding, MIG (metal/inert gas) welding, resistance welding, seam welding, spot welding), pressure welding (ultrasonic welding, friction stir welding), and brazing and soldering;

(b) mechanical bonding method: caulking, bonding with a rivet (bonding with a self-piercing rivet and bonding with a rivet), and a stitcher; and (c) physical bonding method: an adhesive and a (double-sided) adhesive tape.

By bonding a part or all of one carrier and a part or all of the other carrier together using the above bonding method, a laminate having a configuration in which one carrier and the other carrier are laminated and contacted with each other in a separable manner can be fabricated. If one carrier and the other carrier are laminated in a state that one carrier and the other carrier are weakly bonded together, one carrier and the other carrier are separable from each other even without removing the bonding part of one carrier and the other carrier. On the other hand, if one carrier and the other carrier are strongly bonded together, one carrier and the other carrier can be separated from each other by removing the part to which one carrier and the other carrier bonds by cutting, chemical polishing (e.g., etching), mechanical polishing, or the like.

In addition, a printed wiring board can be produced by performing a step of providing two layers of a resin layer and a circuit at least one time on the laminate configured in this way, and a step of, after the two layers of the resin layer and the circuit have been formed at least one time, peeling the ultrathin copper layer or the carrier from the copper foil provided with a carrier of the laminate. Further, two layers of a resin layer and a circuit may be provided on the surface of one side or both sides of the laminate.

The resin substrate, resin layer, resin, or prepreg to be used for the above-described laminate may be the resin layer described herein, and may include resins used for the resin layer described herein, resin curing agents, compounds, curing accelerators, dielectrics, reaction catalysts, cross-linking agents, polymers, prepregs, skeletal materials, and the like. Further, the copper foil provided with a carrier may be smaller than the resin substrate, resin layer, resin, or prepreg when being viewed in a plane.

EXAMPLES

Hereinafter, the present invention will be described in more detail using Examples of the present invention, but the present invention is never limited to these Examples in any way.

1. Fabrication of Copper Foil Provided with Carrier

Using an electrolytic copper foil or a rolled copper foil (Tough Pitch Copper foil, JIS H3100 alloy number: C1100) having a thickness of 12 to 70 μm as a carrier, an intermediate layer and an ultrathin copper layer were formed in this order on the carrier to obtain copper foils provided with a carrier having a thickness of 1 to 5 μm for Examples 1 to 23 and Comparative Example 1 by using the following method.

Note that the surface roughness of a rolled copper foil can be controlled by controlling the surface roughness of a mill roll used in rolling. The surface roughness of a rolled copper foil can be increased by increasing the surface roughness of a mill roll used in rolling. Alternatively, the surface roughness of a rolled copper foil can be decreased by decreasing the surface roughness of a mill roll used in rolling. It is recommended to set the surface roughness of a mill roll to Ra=0.1 μm or more and 2.0 μm or less, for example.

In addition, the surface roughness of the shiny surface (glossy surface) of an electrolytic copper foil can be controlled by controlling the surface roughness of an electrolytic drum used in fabricating an electrolytic copper foil. The surface roughness of the shiny surface (glossy surface) of an electrolytic copper foil can be increased by increasing the surface roughness of an electrolytic drum. Alternatively, the surface roughness of the shiny surface (glossy surface) of an electrolytic copper foil can be decreased by decreasing the surface roughness of an electrolytic drum. It is recommended to set the roughness of an electrolytic drum to Rz=1.0 μm or more and 6.0 μm or less, for example.

In addition, the surface roughness of the mat surface (deposition surface) of an electrolytic copper foil can be controlled by controlling the copper concentration of an electrolyte, the current density, and the electrolyte temperature in fabricating an electrolytic copper foil. The surface roughness of the mat surface (deposition surface) of an electrolytic copper foil can be increased by decreasing the copper concentration of an electrolyte, increasing the current density, and lowering the electrolyte temperature in fabricating an electrolytic copper foil. Alternatively, the surface roughness of the mat surface (deposition surface) of an electrolytic copper foil can be decreased by increasing the copper concentration of an electrolyte, decreasing the current density, and raising the electrolyte temperature in fabricating an electrolytic copper foil. It is recommended to set the copper concentration of an electrolyte to 50 to 130 g/L, the current density to 50 to 120 A/dm$^2$, and the electrolyte temperature to 40 to 90° C., for example. Here, an aqueous solution of sulfuric acid and copper sulfate was used for the electrolyte in fabricating an electrolytic copper foil. Further, in the case that it is required to make the surface roughness of the mat surface (deposition surface) of an electrolytic copper foil smaller (for example, Rz is 1.5 μm or less or Rz=1.0 to 1.5 μm), it is recommended to add a gross agent to the electrolyte. Known gloss agents can be used for the gloss agent. In Example 6, Cl$^-$: 20 to 50 ppm by mass, polyethylene glycol: 10 to 100 ppm by mass, bis(3-sulfopropyl)disulfide: 10 to 30 ppm by mass, and thiourea: 10 to 50 ppm by mass were added as the gloss agent. In Example 23, Cl⁻: 30 to 80 ppm by mass, bis(3-sulfopropyl)disulfide: 10 to 50 ppm by mass, and thiourea: 10 to 50 ppm by mass were added as the gloss agent. An amine compound represented by the following structural formula: 10 to 50 ppm was added:

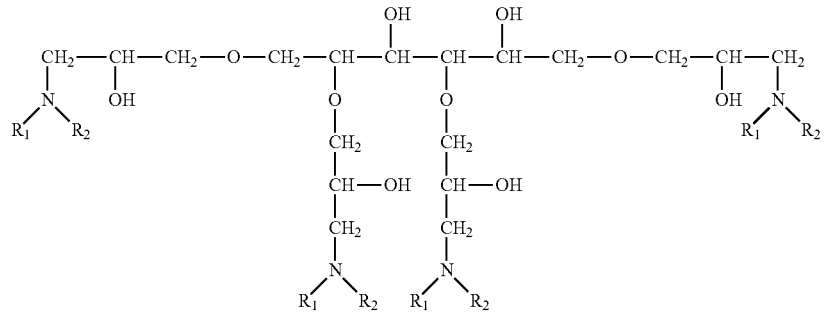

wherein $R_1$ and $R_2$ are selected from the group consisting of a hydroxyalkyl group, an ether group, an aromatic group, an aromatic-substituted alkyl group, an unsaturated hydrocarbon group, and an alkyl group.

Formation of Intermediate Layer

An intermediate layer was formed on a carrier as described in the column "Intermediate Layer" in Table. The treatment conditions are shown below. Note that, for example, "Ni/organic substance" means that a nickel plating treatment was performed followed by an organic substance treatment.

The glossy surface (shiny surface) of the above electrolytic copper foil or the rolled copper foil was provided with an intermediate layer with a roll-to-roll continuous plating line under the following conditions.

(1) "Ni": Ni Treatment (Ni Plating)
Solution composition: nickel sulfate concentration of 200 to 300 g/L, trisodium citrate concentration of 2 to 10 g/L
pH: 2 to 4
Solution temperature: 40 to 70° C.
Current density: 1 to 15 A/dm²
Amount of Ni deposited: 8,000 μg/dm²

Note that the balance of a treatment solution used in electrolysis, a surface treatment, plating, or the like employed in the present invention is water unless otherwise noted.

(2) "Chromate": Electrolytic Chromate Treatment
A Cr layer in an amount to be deposited of 10 μg/dm² was deposited by an electrolytic chromate treatment under the following conditions.
Solution composition: potassium dichromate concentration of 1 to 10 g/L, zinc concentration of 0 to 5 g/L
pH: 3 to 4
Solution temperature: 50 to 60° C.
Current density: 0.1 to 3.0 A/dm²

"Organic Substance": Organic Substance Layer Formation Treatment
An organic substance layer formation treatment was performed by showering and spraying with an aqueous solution having a solution temperature of 40° C. and a pH of 5 that included carboxybenzotriazole (CBTA) in a concentration of 1 to 30 g/L for 20 to 120 seconds.
As a result of measurement of the thickness of the organic substance layer using the above method, the thickness of the organic substance layer was found to be 13 nm.
"Ni—Mo": Nickel-Molybdenum Alloy Plating Solution composition: Ni sulfate hexahydrate: 50 g/dm³, sodium molybdate dihydrate: 60 g/dm³, sodium citrate: 90 g/dm³
Solution temperature: 30° C.
(Current density) 1 to 4 A/dm²
(Conduction time) 3 to 25 seconds
Amount of Ni deposited: 3,250 μg/dm²
Amount of Mo deposited: 420 μg/dm²
"Cr": Chromium Plating
Solution composition: CrOhd 3: 200 to 400 g/L, $H_2SO_4$: 1.5 to 4 g/L
(pH) 1 to 4
Solution temperature: 45 to 60° C.
(Current density) 10 to 40 A/dm²
(Conduction time) 1 to 20 seconds Amount of Cr deposited: 350 μg/dm²
"Co—Mo": Cobalt-Molybdenum Alloy Plating
Solution composition: Co sulfate: 50 g/dm³, sodium molybdate dihydrate: 60 g/dm³, sodium citrate: 90 g/dm³
Solution temperature: 30 to 80° C.
(Current density) 1 to 4 A/dm²
(Conduction time) 3 to 25 seconds
Amount of Co deposited: 420 μg/dm²
Amount of Mo deposited: 560 μg/dm²
"Ni—P": Nickel-Phosphorous Alloy Plating
Solution composition: Ni: 30 to 70 g/L, P: 0.2 to 1.2 g/L
(pH) 1.5 to 2.5
Solution temperature: 30 to 40° C.
(Current density) 1.0 to 10.0 A/dm²
(Conduction time) 0.5 to 30 seconds
Amount of Ni deposited: 5,320 μg/dm²
Amount of P deposited: 390 μg/dm²

Ultrathin Copper Layer Formation

Subsequently, a 1 to 5 μm-thick ultrathin copper layer was formed above the intermediate layer with a roll-to-roll continuous plating line by electroplating under the following conditions to fabricate a copper foil provided with a carrier.
Solution composition: copper concentration of 30 to 120 g/L, sulfuric acid concentration of 20 to 120 g/L, Cl⁻: 20 to 50 ppm by mass, polyethylene glycol: 10 to 100 ppm by mass, bis(3-sulfopropyl)disulfide: 10 to 30 ppm by mass, thiourea: 10 to 50 ppm by mass
Solution temperature: 20 to 80° C.
Current density: 10 to 100 A/dm²

Next, the carrier side surface and/or the ultrathin copper layer side surface of the copper foil provided with a carrier were/was subjected to various surface treatments of any of roughening treatments (1) to (3), a heat resistant treatment, an anti-corrosion treatment, and coating with a silane coupling agent. In Examples 1, 8 to 14, and 23, neither roughening treatment for the carrier side nor roughening treatment for the ultrathin copper layer side was carried out. Respective treatment conditions are shown below.

Roughening Treatment

Roughening Treatment (1) (Coarse Roughening):

Electrolyte composition: 10 to 30 g/L of Cu (added as copper sulfate pentahydrate, the same applies hereafter), 80 to 120 g/L of sulfuric acid
Solution temperature: 20 to 40° C.
Current density: 120 to 140 A/dm$^2$ The carrier side surface or the ultrathin copper layer side surface of the copper foil provided with a carrier which had been subjected to the above roughening treatment (1) was subjected to cover plating in a copper electrolyte bath containing sulfuric acid/copper sulfate in order to prevent the roughened particle from being peeled out and improve the peel strength. The cover plating conditions are shown below.

Solution composition: copper concentration of 20 to 40 g/L, sulfuric acid concentration of 80 to 120 g/L
Solution temperature: 40 to 50° C.
Current density: 10 to 50 A/dm$^2$ Roughening Treatment (2) (Moderate Roughening):

Solution composition: copper concentration of 10 to 30 g/L (added as copper sulfate pentahydrate, the same applies hereafter), sulfuric acid concentration of 80 to 120 g/L
Solution temperature: 20 to 40° C.
Current density: 80 to 100 A/dm$^2$ The carrier side surface or the ultrathin copper layer side surface of the copper foil provided with a carrier which had been subjected to the above roughening treatment (2) was subjected to cover plating in a copper electrolyte bath containing sulfuric acid/copper sulfate in order to prevent the roughened particle from being peeled out and improve the peel strength. The cover plating conditions are shown below.

Solution composition: copper concentration of 20 to 40 g/L, sulfuric acid concentration of 80 to 120 g/L
Solution temperature: 40 to 50° C.
Current density: 10 to 50 A/dm$^2$ Roughening Treatment (2)-2 (Moderate Roughening):

Solution composition: copper concentration of 10 to 30 g/L (added as copper sulfate pentahydrate, the same applies hereafter), sulfuric acid concentration of 80 to 120 g/L
Solution temperature: 20 to 40° C.
Current density: 105 to 115 A/dm$^2$ The carrier side surface or the ultrathin copper layer side surface of the copper foil provided with a carrier which had been subjected to the above roughening treatment (2) was subjected to cover plating in a copper electrolyte bath containing sulfuric acid/copper sulfate in order to prevent the roughened particle from being peeled out and improve the peel strength. The cover plating conditions are shown below. Solution composition: copper concentration of 20 to 40 g/L, sulfuric acid concentration of 80 to 120 g/L
Solution temperature: 40 to 50° C.
Current density: 10 to 50 A/dm$^2$ Roughening Treatment (3) (Fine Roughening):

Solution composition: copper concentration of 10 to 20 g/L, cobalt concentration of 1 to 10 g/L, nickel concentration of 1 to 10 g/L
pH: 1 to 4
Solution temperature: 30 to 50° C.
Current density: 20 to 30 A/dm$^2$ The ultrathin copper layer side surface of the copper foil provided with a carrier which had been subjected to the roughening treatment (3) under the above conditions was subjected to Co—Ni plating to form a heat resistant layer. The plating conditions are shown below.
Solution composition: cobalt concentration of 1 to 30 g/L, nickel concentration of 1 to 30 g/L
pH: 1.0 to 3.5
Solution temperature: 30 to 80° C.
Current density 1 to 10 A/dm$^2$ Heat Resistant Treatment Heat Resistant Layer (Zinc-Nickel Plating) Formation Treatment:

Solution composition: nickel concentration of 10 to 30 g/L, zinc concentration of 1 to 15 g/L
Solution temperature: 30 to 50° C.
Current density: 1 to 10 A/dm$^2$ Anti-Corrosion Treatment Chromate Treatment:

Solution composition: potassium dichromate concentration of 3 to 5 g/L, zinc concentration of 0.1 to 1 g/L
Solution temperature: 30 to 50° C.
Current density of 0.1 to 3.0 A/dm$^2$ Silane Coupling Treatment The treatment was performed by spraying a solution of pH 7 to 8 containing 0.2 to 2% by weight of an alkoxysilane to coat with the silane coupling agent.

Examples 1, 8 to 14, and 23

A copper foil provided with a carrier having a thickness listed in Table was produced using the above method, and a copper foil was produced the carrier side surface and the ultrathin copper layer side surface of which were not subjected to a roughening treatment and subjected only to the heat resistant treatment, the anti-corrosion treatment, and the silane coupling treatment.

Examples 2, 15, and 22

A copper foil provided with a carrier having a thickness listed in Table was produced using the above method, and a copper foil was produced the ultrathin copper layer side surface of which was subjected to the roughening treatment (2) (moderate roughening) and further subjected to the heat resistant treatment, the anti-corrosion treatment, and the silane coupling treatment.

Examples 3, 4, 6, 7, and 16 to 19

A copper foil provided with a carrier having a thickness listed in Table was produced using the above method, and a copper foil was produced the carrier side surface of which was subjected to the roughening treatment (2) (moderate roughening) and further subjected to the heat resistant treatment, the anti-corrosion treatment, and the silane coupling treatment.

Example 5

A copper foil provided with a carrier having a thickness listed in Table was produced using the above method, and a copper foil was produced the carrier side surface of which was subjected to the roughening treatment (3) (fine roughening) and further subjected to the heat resistant treatment, the anti-corrosion treatment, and the silane coupling treatment.

Example 20

A copper foil provided with a carrier having a thickness listed in Table was produced using the above method, and a copper foil was produced the carrier side surface of which was subjected to the roughening treatment (2)-2 (moderate roughening) and further subjected to the heat resistant treatment, the anti-corrosion treatment, and the silane coupling treatment.

Example 21

A copper foil provided with a carrier having a thickness listed in Table was produced using the above method, and a copper foil was produced the carrier side surface and the ultrathin copper layer side surface of which were subjected to the roughening treatment (2)-2 (moderate roughening) and further subjected to the heat resistant treatment, the anti-corrosion treatment, and the silane coupling treatment.

Comparative Example 1

A copper foil provided with a carrier having a thickness listed in Table was produced using the above method, and a copper foil was produced the carrier side surface of which was subjected to the roughening treatment (1) (coarse roughening) and further subjected to the heat resistant treatment, the anti-corrosion treatment, and the silane coupling treatment.

2. Evaluation of Copper Foil Provided with Carrier

Evaluations were performed using the following methods for each of the copper foils provided with a carrier obtained as described above.

Surface Roughness

The ten point average surface roughness Rz of the surface of the carrier of the copper foil provided with a carrier opposite to the ultrathin copper layer side was measured using the laser microscope LEXT OLS4000 manufactured by OLYMPUS CORPORATION based on JIS B0601-1994. Rz was measured for arbitrary 10 points and the average value of Rz at the 10 points was defined as the value of Rz. Further, the ten point average surface roughness Rz of the ultrathin copper layer side surface of the carrier was measured in the same way. Furthermore, the ten point average surface roughness Rz of the surface of the ultrathin copper layer opposite to the intermediate layer was measured in the same way.

In addition, the maximum cross-sectional height Rt in the roughness curve of the surface of the carrier of the copper foil provided with a carrier opposite to the ultrathin copper layer side was measured using the laser microscope LEXT OLS4000 manufactured by OLYMPUS CORPORATION based on JIS B0601-2001. Rt was measured for arbitrary 10 points and the average value of Rt at the 10 points was defined as the value of Rt.

In addition, the arithmetic average roughness Ra of the surface of the carrier of the copper foil provided with a carrier opposite to the ultrathin copper layer was measured using the laser microscope LEXT OLS4000 manufactured by OLYMPUS CORPORATION based on JIS 30601-1994. Ra was measured for arbitrary 10 points and the average value of Ra at the 10 points was defined as the value of Ra.

Each value of the above Rz, Ra, and Rt was determined by a measurement for the ultrathin copper layer and the carrier surface in a direction perpendicular to a traveling direction of an electrolytic copper foil, which was used as a carrier, in an apparatus for fabricating an electrolytic copper foil, or a direction perpendicular to a traveling direction of a rolled copper foil in an apparatus for fabricating a rolled copper foil (TD) using an objective lens with a magnification of ×500 under conditions that the evaluation length was 258 μm and the cutoff value was zero. The temperature of the environment for measuring Rz, Ra, and Rt of the surface using a laser microscope was 23 to 25° C.

Normal State Peel Strength

The peel strength between the carrier and the ultrathin copper layer was measured based on a 90° peeling method (JIS C 6471 8.1) in which the carrier side of the copper foil provided with a carrier produced was pulled in a load cell.

Peel Strength After Normal Press

The ultrathin copper layer side of the copper foil provided with a carrier produced was pasted on a resin substrate to heat-press in the atmosphere under conditions of 15 kgf/cm$^2$, 220° C., and 90 minutes, and thereafter the carrier side was pulled in a load cell to measure the peel strength between the carrier and the ultrathin copper layer based on a 90° peeling method (JIS C 6471 8.1).

Peel Strength After Reverse Press

A copper plating layer was formed on the copper foil provided with a carrier produced by further plating up the ultrathin copper layer side surface with a copper plating. At this time, the copper plating layer was formed so that the total thickness of the ultrathin copper layer and the copper plating layer was 18 μm. Next, the carrier side of the copper foil provided with a carrier was pasted on a resin substrate to heat-press in the atmosphere under conditions of 15 kgf/cm$^2$, 220° C., and 90 minutes, and thereafter the ultrathin copper layer side was pulled in a load cell to measure the peel strength between the carrier and the ultrathin copper layer based on a 90° peeling method (JIS C 6471 8.1). In Comparative Example 1, the ultrathin copper layer could not be peeled from the carrier. In Comparative Example 2, the carrier and a resin substrate could not be laminated together and as a result the measurement could not be performed.

Peel Properties and Productivity

Fabrication of Coreless Substrate

The copper foil provided with a carrier according to each of Examples and Comparative Examples was heat-pressed to laminate on both sides of an FR-4 prepreg larger than the copper foil provided with a carrier from the carrier side in the atmosphere under conditions of 15 kgf/cm$^2$, 220° C., and 90 minutes, and as a result a laminate was obtained. Because the laminate was fabricated using a prepreg larger than the copper foil provided with a carrier, the edge face of the copper foil provided with a carrier in the obtained laminate is covered with a resin (prepreg).

A hole having a diameter of 1 mm was made at 4 points at which the sheet-like carrier was exposed in the thus-produced laminate for a guide hole for positioning in a subsequent building-up step. On both sides of the laminate, an FR-4 prepreg and a copper foil (JTC 12 μm (product name) manufactured by JX Nippon Mining & Metals Corporation) were stacked in order, which was subjected to hot press at a pressure of 3 MPa at 170° C. for 100 minutes to produce a 4-layer copper-clad laminate.

Next, a hole having a diameter of 100 μm which penetrated the copper foil on the surface of the 4-layer copper-clad laminate and the underlying insulating layer (cured prepreg) was made using a laser processing machine. Subsequently, the copper foil surface on the laminate exposed at the bottom of the hole, the side wall of the hole, and the copper foil on the surface of the 4-layer copper-clad laminate were subjected to copper plating using electroless copper plating and copper electroplating to form an electrical connection between the copper foil on the laminate and the copper foil on the surface of the 4-layer copper-clad laminate. Next, a part of the copper foil on the surface of the 4-layer copper-clad laminate was etched with a ferric chloride etching solution to form a circuit. In this way, a 4-layer build-up substrate was produced.

Subsequently, the 4-layer build-up substrate was cut at a position inside of a part at which the edge face of the copper foil provided with a carrier was adhered to the prepreg when the laminate was viewed in a plane, and thereafter the carrier and the ultrathin copper layer of the copper foil provided with a carrier in the laminate were mechanically peeled apart and separated to obtain two pairs of 2-layer build-up wiring boards.

Subsequently, the copper foil to which the sheet-like carrier had closely adhered on the two pairs of 2-layer build-up wiring boards was etched to form a wiring, and as a result two pairs of 2-layer build-up wiring boards were obtained.

The presence/absence of peeling between the resin substrate (FR-4 prepreg) and the carrier (peel properties) was evaluated in producing the above two pairs of 2-layer build-up wiring boards. The evaluation criteria for the peel properties are shown below.

double-circle: "no peeling in 10 productions," circle circle: "1 peeling in 10 productions," circle: "2 to 3 peelings in 10 productions," triangle: "4 peelings in 10 productions," X-mark: "5 or more peelings in 10 productions"

The peel strength between the ultrathin copper layer and the carrier in producing the above two pairs of 2-layer build-up wiring boards influences the productivity of a printed wiring board. Specifically, in the case that the peel strength between the ultrathin copper layer and the carrier is 50 N/m or more, it takes so much time to peel apart and hence the productivity is poor (it takes 10 minutes/copper foil provided with a carrier or more to peel apart). In the case of 20 N/m or more, it takes much time to peel apart and hence the productivity is poor (it takes 2 minutes/copper foil provided with a carrier or more to peel apart). From this perspective, the evaluation criteria for productivity were determined as follows.

double-circle: "the peel strength was 20 N/m or less in all cases of 10 productions," circle circle: "the peel strength was 20 N/m or more in 1 or more and less than 5 cases of 10 productions," circle: "the peel strength was 20 N/m or more in 5 or more cases of 10 productions," triangle: "the peel strength was 50 N/m or more in 1 or more cases of 10 productions," X-mark: "nonpeelable in 1 or more cases of 10 productions"

The test conditions and the results are shown in Table 1.

TABLE 1

| | Carrier | | | | | | Ultrathin Copper | Roughening |
| | | Surface Roughness of Surface of Carrier Opposite to Ultrathin Copper Layer Side | | | Surface Roughness of Ultrathin Copper Layer Side Surface of Carrier | | | |
| No | Type of Carrier | Thickness (μm) | Rz (μm) | Rt (μm) | Ra (μm) | Rz (μm) | Intermediate Layer | Layer Thickness (μm) | Treatment on Carrier Side |
| --- | --- | --- | --- | --- | --- | --- | --- | --- | --- |
| Example 1 | Electrolytic copper foil | 18 | 3.1 | 3.5 | 0.51 | 1.5 | Ni/chromate | 5 | None |
| Example 2 | Electrolytic copper foil | 18 | 3.1 | 3.5 | 0.51 | 1.5 | Ni/chromate | 5 | None |
| Example 3 | Electrolytic copper foil | 18 | 5.0 | 5.8 | 0.83 | 1.5 | Ni/chromate | 5 | Roughening treatment (2) |
| Example 4 | Electrolytic copper foil | 18 | 5.0 | 5.8 | 0.83 | 1.5 | Ni/chromate | 3 | Roughening treatment (2) |
| Example 5 | Electrolytic copper foil | 18 | 4.0 | 4.8 | 0.66 | 1.5 | Ni/chromate | 5 | Roughening treatment (3) |
| Example 6 | Electrolytic copper foil | 18 | 1.2 | 1.4 | 0.2 | 1.1 | Ni/chromate | 5 | Roughening treatment (2) |
| Example 7 | Rolled copper foil | 18 | 1.0 | 1.2 | 0.17 | 1.0 | Ni/chromate | 5 | Roughening treatment (2) |
| Example 8 | Electrolytic copper foil | 35 | 3.2 | 3.9 | 0.53 | 1.5 | Ni/chromate | 5 | None |
| Example 9 | Electrolytic copper foil | 12 | 3.0 | 3.6 | 0.5 | 1.5 | Ni/chromate | 5 | None |
| Example 10 | Electrolytic copper foil | 70 | 3.3 | 3.9 | 0.54 | 1.5 | Ni/chromate | 5 | None |
| Example 11 | Electrolytic copper foil | 18 | 3.1 | 3.7 | 0.51 | 1.5 | Ni/chromate | 1 | None |
| Example 12 | Electrolytic copper foil | 18 | 3.1 | 3.7 | 0.51 | 1.5 | Ni/chromate | 2 | None |
| Example 13 | Electrolytic copper foil | 18 | 3.1 | 3.7 | 0.51 | 1.5 | Ni/chromate | 3 | None |
| Example 14 | Electrolytic copper foil | 18 | 3.1 | 3.7 | 0.51 | 1.5 | Ni/organic substance | 1.5 | None |
| Example 15 | Electrolytic copper foil | 18 | 3.1 | 3.7 | 0.51 | 1.5 | Ni—Mo | 3 | None |
| Example 16 | Electrolytic copper foil | 18 | 5.0 | 5.9 | 0.83 | 1.5 | Cr | 2 | Roughening treatment (2) |
| Example 17 | Electrolytic copper foil | 18 | 5.0 | 5.9 | 0.83 | 1.5 | Co—Mo | 5 | Roughening treatment (2) |
| Example 18 | Electrolytic copper foil | 18 | 4.0 | 4.7 | 0.66 | 1.5 | Ni—P/ chromate | 2 | Roughening treatment (2) |
| Example 19 | Electrolytic copper foil | 18 | 5.0 | 5.9 | 0.83 | 1.5 | Ni/Co—Mo | 5 | Roughening treatment (2) |
| Example 20 | Electrolytic | 18 | 6.0 | 6.8 | 0.95 | 1.5 | Ni/chromate | 5 | Roughening |

TABLE 1-continued

| No | | | | | | | | | |
|---|---|---|---|---|---|---|---|---|---|
| Example 21 | copper foil Electrolytic copper foil | 18 | 6.0 | 6.9 | 0.96 | 1.5 | Ni/Co—Mo | 5 | treatment (2)-2 Roughening treatment (2)-2 |
| Example 22 | Rolled copper foil | 18 | 0.6 | 0.7 | 0.1 | 0.6 | Ni/chromate | 5 | None |
| Example 23 | Electrolytic copper foil | 35 | 0.6 | 0.8 | 0.12 | 1.0 | Ni/chromate | 5 | None |
| Comparative Example 1 | Electrolytic copper foil | 18 | 6.5 | 7.7 | 1.1 | 1.5 | Ni/chromate | 5 | Roughening treatment (1) |

| No | Roughening Treatment on Ultrathin Copper Layer Side | Surface Roughness Rz of Surface of Ultrathin Copper Layer Opposite to Intermediate Layer (μm) | Normal State Peel Strength (N/m) | Peel Strength After Normal Press (N/m) | Peel Strength After Reverse Press (N/m) | Peel Properties | Productivity |
|---|---|---|---|---|---|---|---|
| Example 1 | None | 1.1 | 1.8 | 5.3 | 4.3 | ○○ | ⊚ |
| Example 2 | Roughening treatment (2) | 1.4 | 3.0 | 15.0 | 17.6 | ○○ | ○○ |
| Example 3 | None | 1.1 | 1.8 | 9.3 | 42.1 | ⊚ | Δ |
| Example 4 | None | 1.0 | 2.3 | 13.0 | 26.7 | ⊚ | ○ |
| Example 5 | None | 1.2 | 1.8 | 8.5 | 39.2 | ○○ | Δ |
| Example 6 | None | 1.2 | 1.9 | 9.5 | 43.7 | ○ | Δ |
| Example 7 | None | 1.0 | 2.1 | 11.7 | 49.2 | Δ | Δ |
| Example 8 | None | 1.1 | 1.8 | 5.3 | 4.3 | ○○ | ⊚ |
| Example 9 | None | 1.1 | 1.9 | 5.6 | 4.5 | ○○ | ⊚ |
| Example 10 | None | 1.1 | 1.7 | 5.2 | 4.1 | ○○ | ⊚ |
| Example 11 | None | 0.8 | 1.7 | 5.2 | 4.2 | ○○ | ⊚ |
| Example 12 | None | 0.8 | 1.8 | 5.3 | 4.4 | ○○ | ⊚ |
| Example 13 | None | 0.9 | 1.8 | 5.4 | 4.5 | ○○ | ⊚ |
| Example 14 | None | 0.7 | 1.7 | 5.2 | 4.4 | ○○ | ⊚ |
| Example 15 | Roughening treatment (2) | 1.5 | 3.1 | 14.9 | 17.3 | ○○ | ○○ |
| Example 16 | None | 1.0 | 1.9 | 9.2 | 41.9 | ⊚ | Δ |
| Example 17 | None | 1.2 | 2.3 | 12.9 | 26.5 | ⊚ | ○ |
| Example 18 | None | 0.8 | 1.8 | 8.4 | 39.1 | ○○ | Δ |
| Example 19 | None | 1.2 | 2.3 | 11.9 | 25.4 | ⊚ | ○ |
| Example 20 | None | 1.1 | 2.2 | 10.1 | 44.3 | ⊚ | Δ |
| Example 21 | Roughening treatment (2)-2 | 1.6 | 2.5 | 18.3 | 32.5 | ⊚ | ○ |
| Example 22 | Roughening treatment (2) | 1.4 | 2.0 | 10.4 | 5.0 | Δ | ⊚ |
| Example 23 | None | 0.7 | 1.8 | 10.1 | 4.6 | Δ | ⊚ |
| Comparative Example 1 | None | 0.9 | 1.8 | 10.3 | Nonpeelable | ⊚ | X |

Evaluation Result

For the laminate produced by laminating the copper foil provided with a carrier on a resin substrate in each of Examples 1 to 23, the ultrathin copper layer could be peeled from the carrier well and the peel properties and the productivity in producing a build-up wiring board using the copper foil provided with a carrier were good.

On the other hand, for the laminate produced by laminating the copper foil provided with a carrier on a resin substrate in Comparative Example 1, the ultrathin copper layer could not be peeled from the carrier well. In addition, the productivity in producing a build-up wiring board using the copper foil provided with a carrier was poor.

The invention claimed is:

1. A copper foil provided with a carrier comprising, in order, a carrier, an intermediate layer, and an ultrathin copper layer, wherein at least one of the following (i-a) to (iii-a) is satisfied:
   (i-a) when a surface of the carrier facing away from the ultrathin copper layer is measured using a laser microscope based on JIS B0601-1994, a ten point average roughness Rz of the surface is 6.0 pm or less; (ii-a) when a surface of the carrier facing away from the ultrathin copper layer is measured using a laser microscope based on JIS B0601-1994, an arithmetic average roughness Ra of the surface is 1.0 pm or less; (iii-a) when a surface of the carrier facing away from the ultrathin copper layer is measured using a laser microscope based on JIS B0601-2001, a maximum cross-sectional height Rt in a roughness curve of the surface is 7.0 μm or less.

2. The copper foil provided with a carrier according to claim 1, wherein at least one of the following (i-b) to (iii-b) is satisfied:
   (i-b) when a surface of the carrier facing way from the ultrathin copper layer is measured using a laser microscope based on JIS B0601-1994, a ten point average roughness Rz of the surface is 0.9 μm or more;
   (ii-b) when a surface of the carrier facing way from the ultrathin copper layer is measured using a laser microscope based on JIS B0601-1994, an arithmetic average roughness Ra of the surface is 0.12 μm or more;
   (iii-b) when a surface of the carrier facing way from the ultrathin copper layer is measured using a laser microscope based on JIS B0601-2001, a maximum cross-sectional height Rt in a roughness curve of the surface is 1.1 μm or more.

3. The copper foil provided with a carrier according to claim 1 comprising one or more layers selected from the group consisting of a roughened layer, a heat resistant layer, an anti-corrosion layer, a chromate-treated layer, and a silane coupling-treated layer on a surface of the carrier facing way from the ultrathin copper layer.

4. The copper foil provided with a carrier according to claim 3, wherein
the roughened layer comprises a layer consisting of a simple substance selected from the group consisting of copper, nickel, cobalt, phosphorus, tungsten, arsenic, molybdenum, chromium, and zinc, or an alloy comprising one or more thereof, and/or
comprises a layer formed using a sulfuric acid-copper sulfate electrolytic bath comprising one or more selected from the group consisting of a sulfuric acid alkyl ester salt, tungsten, and arsenic.

5. The copper foil provided with a carrier according to claim 3 comprising no roughened layer on a surface of the carrier facing way from the ultrathin copper layer, or
comprising no roughened layer and comprising one or more layers selected from the group consisting of a heat resistant layer, an anti-corrosion layer, a chromate-treated layer, and a silane coupling-treated layer on a surface of the carrier facing way from the ultrathin copper layer.

6. The copper foil provided with a carrier according to claim 1 comprising one or more layers selected from the group consisting of a roughened layer, a heat resistant layer, an anti-corrosion layer, a chromate-treated layer, and a silane coupling-treated layer on the ultrathin copper layer surface.

7. The copper foil provided with a carrier according to claim 6, wherein the roughened layer is a layer consisting of a simple substance selected from the group consisting of copper, nickel, cobalt, phosphorus, tungsten, arsenic, molybdenum, chromium, and zinc, or an alloy comprising one or more thereof.

8. The copper foil provided with a carrier according to claim 6 comprising no roughened layer on a surface of the ultrathin copper layer, or
comprising no roughened layer and comprising one or more layers selected from the group consisting of a heat resistant layer, an anti-corrosion layer, a chromate-treated layer, and a silane coupling-treated layer on a surface of the ultrathin copper layer.

9. The copper foil provided with a carrier according to claim 8 comprising a resin layer on the ultrathin copper layer surface or above one or more layers selected from the group consisting of a roughened layer, the heat resistant layer, an anti-corrosion layer, a chromate-treated layer, and a silane coupling-treated layer formed on the ultrathin copper layer surface.

10. The copper foil provided with a carrier according to claim 9, wherein the resin layer is a resin for adhesion and/or a resin in a semi-cured state.

11. The copper foil provided with a carrier according to claim 6 comprising a resin layer above one or more layers selected from the group consisting of a roughened layer, the heat resistant layer, an anti-corrosion layer, a chromate-treated layer, and a silane coupling-treated layer formed on the ultrathin copper layer surface.

12. A laminate comprising a copper foil provided with a carrier according to claim 1.

13. A laminate comprising a copper foil provided with a carrier according to claim 12 and a resin, wherein a part or all of an edge face of the copper foil provided with a carrier is covered with the resin.

14. A method for fabricating a printed wiring board comprising:

a step of providing two layers of a resin layer and a circuit at least one time on one side or both sides of a laminate according to claim 12; and
a step of, after the two layers of the resin layer and the circuit have been formed, peeling the carrier or the ultrathin copper layer from the copper foil provided with a carrier constituting the laminate.

15. A laminate, wherein one copper foil provided with a carrier according to claim 1 is laminated from the carrier side or the ultrathin copper layer side on the carrier side or the ultrathin copper layer side of another copper foil provided with a carrier according to claim 1.

16. A printed wiring board fabricated comprising a copper foil provided with a carrier according to claim 1.

17. A method for fabricating a printed wiring board comprising:
forming a copper-clad laminate by carrying out
a step of preparing a copper foil provided with a carrier according to claim 1 and an insulating substrate,
a step of laminating the copper foil provided with a carrier and the insulating substrate, and
a step of, after the copper foil provided with a carrier and the insulating substrate have been laminated, peeling the carrier of the copper foil provided with a carrier; and
then forming a circuit by any of a semi-additive method, a subtractive method, a partly additive method, and a modified semi-additive method.

18. A method for fabricating a printed wiring board comprising:
a step of forming a circuit on the ultrathin copper layer side surface of a copper foil provided with a carrier according to claim 1;
a step of forming a resin layer on the ultrathin copper layer side surface of the copper foil provided with a carrier so that the circuit is buried;
a step of forming a circuit on the resin layer;
a step of peeling the carrier after forming the circuit on the resin layer; and
a step of exposing the circuit buried in the resin layer that is formed on the ultrathin copper layer side surface by, after the carrier has been peeled off, removing the ultrathin copper layer.

19. A method for fabricating a printed wiring board comprising:
a step of laminating a copper foil provided with a carrier according to claim 18 on a resin substrate from the carrier side;
a step of forming a circuit on the ultrathin copper layer side surface of the copper foil provided with a carrier;
a step of forming a resin layer on the ultrathin copper layer side surface of the copper foil provided with a carrier so that the circuit is buried;
a step of forming a circuit on the resin layer;
a step of peeling the carrier after forming the circuit on the resin layer; and
a step of exposing the circuit buried in the resin layer that is formed on the ultrathin copper layer side surface by, after the carrier has been peeled off, removing the ultrathin copper layer.

20. A method for fabricating a printed wiring board comprising:
a step of laminating the ultrathin copper layer side surface or the carrier side surface of a copper foil provided with a carrier according to claim 1 and a resin substrate;
a step of providing two layers of a resin layer and a circuit at least one time on the ultrathin copper layer side surface or the carrier side surface of the copper foil provided with a carrier facing way from a side with the resin substrate laminated thereon; and a step of, after the two layers of the resin layer and the circuit have been formed, peeling the carrier or the ultrathin copper layer from the copper foil provided with a carrier.

21. A method for fabricating a printed wiring board comprising:

a step of laminating the carrier side surface of a copper foil provided with a carrier according to claim 20 and a resin substrate;

a step of providing two layers of a resin layer and a circuit at least one time on the ultrathin copper layer side surface of the copper foil provided with a carrier facing way from a side with the resin substrate laminated thereon; and a step of, after the two layers of the resin layer and the circuit have been formed, peeling the carrier from the copper foil provided with a carrier.

* * * * *

UNITED STATES PATENT AND TRADEMARK OFFICE
CERTIFICATE OF CORRECTION

PATENT NO. : 10,178,775 B2
APPLICATION NO. : 15/002060
DATED : January 8, 2019
INVENTOR(S) : Yoshiyuki Miyoshi et al.

It is certified that error appears in the above-identified patent and that said Letters Patent is hereby corrected as shown below:

In the Claims

At Column 37, Claim number 1, Line number 63, "pm" should read --μm--.

At Column 37, Claim number 1, Line number 67, "pm" should read --μm--.

At Column 38, Claim number 2, Line number 51, "way" should read --away--.

At Column 38, Claim number 2, Line number 55, "way" should read --away--.

At Column 38, Claim number 2, Line number 59, "way" should read --away--.

At Column 39, Claim number 3, Line number 1, "way" should read --away--.

At Column 39, Claim number 5, Line number 16, "way" should read --away--.

At Column 39, Claim number 5, Line number 21, "way" should read --away--.

At Column 41, Claim number 20, Line number 2, "way" should read --away--.

At Column 41, Claim number 21, Line number 16, "way" should read --away--.

Signed and Sealed this
Thirtieth Day of July, 2019

Andrei Iancu
*Director of the United States Patent and Trademark Office*